United States Patent
Kadowaki et al.

(10) Patent No.: US 6,288,600 B1
(45) Date of Patent: Sep. 11, 2001

(54) ELECTRONIC CIRCUIT, SEMICONDUCTOR DEVICE, ELECTRONIC EQUIPMENT, AND TIMEPIECE

(75) Inventors: Tadao Kadowaki; Yoshiki Makiuchi, both of Chino; Shinji Nakamiya, Matsumoto, all of (JP)

(73) Assignee: Seiko Epson Corporation, Tokyo (JP)

(*) Notice: Subject to any disclaimer, the term of this patent is extended or adjusted under 35 U.S.C. 154(b) by 0 days.

(21) Appl. No.: 09/171,798

(22) PCT Filed: Mar. 3, 1998

(86) PCT No.: PCT/JP98/00866

§ 371 Date: Jan. 15, 1999

§ 102(e) Date: Jan. 15, 1999

(87) PCT Pub. No.: WO98/39693

PCT Pub. Date: Sep. 11, 1998

(30) Foreign Application Priority Data

Mar. 4, 1997 (JP) .................................................. 9-065502

(51) Int. Cl.[7] .................................................. G05F 1/10
(52) U.S. Cl. .................. 327/535; 327/530; 327/538; 327/541; 327/560; 323/313
(58) Field of Search ....................... 327/530, 535, 327/538, 540, 541, 542, 543, 560, 561, 562, 563, 50, 52, 54; 323/313, 316

(56) References Cited

U.S. PATENT DOCUMENTS

| | | | | |
|---|---|---|---|---|
| 5,729,162 | * | 3/1998 | Rouy ..................................... | 327/538 |
| 5,804,956 | * | 9/1998 | Pulvirenti ............................. | 323/277 |
| 5,818,212 | * | 10/1998 | Min et al. ............................ | 327/538 |
| 5,825,234 | * | 10/1998 | Sung et al. ........................... | 327/378 |
| 5,942,933 | * | 8/1999 | Yang ..................................... | 327/530 |

FOREIGN PATENT DOCUMENTS

| | | |
|---|---|---|
| A-6-67744 | 3/1994 | (JP) . |
| A-8-305453 | 11/1996 | (JP) . |
| A-9-18231 | 1/1997 | (JP) . |

* cited by examiner

*Primary Examiner*—Terry D. Cunningham
*Assistant Examiner*—An T. Luu
(74) *Attorney, Agent, or Firm*—Oliff & Berridge, PLC

(57) ABSTRACT

A constant-voltage generation circuit is provided which creates a constant voltage. The constant-voltage generation circuit may consist of a first voltage creation circuit for creating a reference voltage and a second voltage creation circuit for creating a constant voltage which has a predetermined relationship with the reference voltage. The first voltage creation circuit may consist of a constant-current source for supplying a constant current and a voltage-control transistor through which this constant current flows, for outputting the reference voltage on the basis of a predetermined potential. The constant current is set to a value within the saturated operating region of the voltage-control transistor.

26 Claims, 15 Drawing Sheets

ELECTRONIC CIRCUIT, SEMICONDUCTOR DEVICE, ELECTRONIC EQUIPMENT, AND TIMEPIECE

TECHNICAL FIELD

This invention relates to an electronic circuit, a semiconductor device, electronic equipment, and a timepiece.

BACKGROUND ART

An electronic circuit that is known in the art comprises a constant-voltage generation circuit that outputs a constant voltage and a crystal oscillation circuit that is driven by this constant voltage. This kind of electronic circuit is widely used in applications such as timepieces, telephones, and computer terminals.

Recent trends in the miniaturization of electronic equipment have made it particularly common to fabricate such electronic circuitry as compact, low-power ICs.

However, electronic circuitry formed as an IC has a problem in that a constant voltage that is output from the constant-voltage generation circuit varies with the effects of temperature.

This is particularly important with a crystal oscillation circuit that is driven by a constant voltage output by a constant-voltage generation circuit because, if that constant voltage should change, the oscillation frequency of the crystal oscillation circuit will also change. This causes a problem in an electronic circuit that generates a reference clock signal for operation based on the oscillation frequency of this crystal oscillation circuit, in that accurate timekeeping is not possible. If a wristwatch is taken by way of example, the environment in which such a wristwatch is used can range from low temperatures to high temperatures. If prior-art electronic circuitry is used in such a wristwatch, therefore, variations in the constant voltage that is output from the constant-voltage generation circuit can cause errors in the time displayed thereby.

It is necessary to set the absolute value of the constant voltage that is output from the constant-voltage generation circuit to be always equal to or greater than the absolute value of the oscillation-stopped voltage of the crystal oscillation circuit. If this voltage falls below the oscillation-stopped voltage, the crystal oscillation circuit will no longer be able to operate.

It is known that the power consumption of the crystal oscillation circuit is proportional to the square of the constant voltage supplied from the constant-voltage generation circuit. To reduce the power consumption of the electronic circuitry, therefore, it is necessary to set the value of the constant voltage that is output from the constant-voltage generation circuit to be as small as possible, within a range that satisfies the condition that it is equal to or greater than the oscillation-stopped voltage of that crystal oscillation circuit.

If such electronic circuitry is formed as a semiconductor integrated circuit, the effects of factors such as errors in impurity implantation will cause subtle changes in the value of the constant voltage output from the constant-voltage generation circuit and the value of the oscillation-stopped voltage of the crystal oscillation circuit.

Since it is not possible to finely adjust the value of the constant voltage that is output from the constant-voltage generation circuit in prior-art electronic circuitry, it is necessary to set the value of this constant voltage to have a sufficiently large margin over the expected value of the oscillation-stopped voltage, from consideration of the risk of a large variation therein. This means that the crystal oscillation circuit is driven by a voltage that is larger than necessary, raising a problem in that it is difficult to reduce the power consumption of the electronic circuitry from this aspect too.

The present invention is devised in the light of the above problems and has as a first objective thereof the provision of an electronic circuit, semiconductor device, electronic equipment, and timepiece wherein the value of the constant voltage that is output from the constant-voltage generation circuit is not affected greatly by changes in temperature.

Another objective of this invention is to provide an electronic circuit, semiconductor device, electronic equipment, and timepiece wherein the value of the constant voltage that is output from the constant-voltage generation circuit can be adjusted finely.

DISCLOSURE OF THE INVENTION

In order to achieve the first of the above objectives, there is provided an electronic circuit having a constant-voltage generation circuit for creating a constant voltage, according to a first aspect of this invention. This constant-voltage generation circuit comprises a first voltage creation circuit for creating a reference voltage, and a second voltage creation circuit for creating the constant voltage to have a predetermined relationship with the reference voltage. The first voltage creation circuit comprises a first constant-current source for supplying a constant current, and a circuit having a first voltage-control transistor through which the constant current is passed and which outputs the reference voltage with reference to a predetermined potential. The constant current is set to a value within a saturated operating region of the first voltage-control transistor.

The second voltage creation circuit may comprise a differential amplifier for amplifying the difference between the reference voltage and a comparison voltage, a second constant-current source for supplying a constant current, a circuit having a second voltage-control transistor to which the constant current is supplied, and an output transistor which is connected in series with the circuit having the second voltage-control transistor to be supplied with the constant current, the resistance of the output transistor being controlled by an output of the differential amplifier; wherein the comparison voltage is output from one end of the circuit having the second voltage-control transistor, using a predetermined potential as reference, while the constant voltage being output from another end of the circuit having the second voltage-control transistor; and wherein the constant current is set to a value within a saturated operating region of the second voltage-control transistor.

According to a second aspect of this invention, there is provided an electronic circuit having a constant-voltage generation circuit for creating a constant voltage. This constant-voltage generation circuit comprises a first voltage creation circuit for creating a reference voltage, and a second voltage creation circuit for creating the constant voltage and a comparison voltage having a predetermined relationship with the constant voltage. The second voltage creation circuit comprises: a differential amplifier for amplifying the difference between the reference voltage and the comparison voltage; a second constant-current source for supplying a constant current; a circuit having a second voltage-control transistor to which the constant current is supplied; and an output transistor which is connected in series with the circuit having the second voltage-control transistor to be supplied with the constant current, the resistance of the output transistor being controlled by an output of the differential amplifier. The comparison voltage is output from one end of the circuit having the second voltage-control transistor, using a predetermined potential as reference, while the constant voltage being output from another end of the circuit having the second voltage-control transistor. The constant current is set to a value within a saturated operating region of the second voltage-control transistor.

This aspect of invention makes it possible to reduce variations in the voltage between the ends of the voltage-control transistor to an ignorable level, even if the value of the constant current supplied from the constant-current source varies slightly because of temperature changes in the environment in which the electronic circuit is used, by setting the value of the constant current supplied by the constant-current source to be within the saturated operating region of the voltage-control transistor. Therefore, the value of at least one of the reference voltage and the comparison voltage output from at least one of the first voltage creation circuit and the second voltage creation circuit remains substantially constant, regardless of the effects of temperature changes, so that the constant-voltage generation circuit can always output a constant voltage.

In this manner, the electronic circuit ensures that the constant-voltage generation circuit thereof can generate and output a constant voltage that does not vary greatly, even if the ambient temperature changes.

In particular, it is possible to maintain a constant oscillation frequency output from a crystal oscillation circuit, even if the ambient temperature varies, by using the constant voltage that is output from this constant-voltage generation circuit as a voltage for driving the oscillation circuit. As a result, it is possible to create an accurate operating reference signal from the oscillation output of this crystal oscillation circuit.

It is preferable to use a field-effect transistor as the voltage-control transistor. It is more preferable to use a field-effect transistor wherein the gate and drain thereof have been short-circuited.

In order to achieve the other of the above described objectives, there is provided an electronic circuit having a constant-voltage generation circuit for creating a constant voltage, according to a third aspect of this invention. This constant-voltage generation circuit comprises a first voltage creation circuit for creating a reference voltage, and a second voltage creation circuit for creating the constant voltage to have a predetermined relationship with the reference voltage. The first voltage creation circuit comprises a first constant-current source for supplying a constant current, and a circuit having a first voltage-control transistor through which the constant current is passed and which outputs the reference voltage with reference to a predetermined potential. As the first voltage-control transistor, one transistor is selected from a plurality of transistors having mutually different current amplification ratios.

The second voltage creation circuit may comprise a differential amplifier for amplifying the difference between the reference voltage and a comparison voltage, a second constant-current source for supplying a constant current, a circuit having a second voltage-control transistor to which the constant current is supplied, and an output transistor which is connected in series with the circuit having the second voltage-control transistor to be supplied with the constant current, the resistance of the output transistor being controlled by an output of the differential amplifier; wherein the comparison voltage and the constant voltage are output with reference to a predetermined potential from one end and another end of the circuit having the second voltage-control transistor; and wherein one transistor from a plurality of transistors having mutually different current amplification ratios is selected as the second voltage-control transistor.

According to a fourth aspect of this invention, there is provided an electronic circuit having a constant-voltage generation circuit for creating a constant voltage. This constant-voltage generation circuit comprises a first voltage creation circuit for creating a reference voltage, and a second voltage creation circuit for creating the constant voltage and a comparison voltage having a predetermined relationship with the constant voltage. The second voltage creation circuit comprises: a differential amplifier for amplifying the difference between the reference voltage and the comparison voltage; a second constant-current source for supplying a constant current; a circuit having a second voltage-control transistor to which the constant current is supplied; and an output transistor which is connected in series with the circuit having the second voltage-control transistor to be supplied with the constant current, the resistance of the output transistor being controlled by an output of the differential amplifier. The comparison voltage and the constant voltage are output with reference to a predetermined potential from one end and another end of the circuit having the second voltage-control transistor. As the second voltage-control transistor, one transistor is selected from a plurality of transistors having mutually different current amplification ratios.

In an electronic circuit in accordance with this aspect of the invention, any desired transistor can be selected from a plurality of transistors having different current amplification ratios, for use as the voltage-control transistor. This makes it possible to finely adjust the value of at least one of the reference voltage and the comparison voltage, so that the value of the constant voltage that is output from the voltage creation circuit can be finely adjusted.

By using the constant voltage that is output from the constant-voltage generation circuit as a voltage for driving a crystal oscillation circuit, it is possible to adjust this drive voltage finely to the necessary minimum limit to match the oscillation-stopped voltage of the crystal oscillation circuit. This means that it is possible to drive the electronic circuitry, particularly the crystal oscillation circuit, stably at a low power consumption.

In particular, it is possible to form circuitry that outputs the optimal constant voltage with respect to the oscillation-stopped voltage of the crystal oscillation circuit, during the fabrication of the electronic circuit. Use of this configuration makes it possible to finely adjust the value of the constant voltage that is output from the constant-voltage generation circuit in such a manner that it is equal to or greater than the oscillation-stopped voltage and is also at the necessary minimum value, even if slight variations occur in the characteristics of the constant-voltage generation circuit or the oscillation-stopped voltage of the crystal oscillation circuit, during the process of fabricating the semiconductor device. Since this fine adjustment can be done during the fabrication of the electronic circuit, or more specifically during the fabrication of the semiconductor device, it is thus possible to fabricate a semiconductor device that is provided with an electronic circuit in which a crystal oscillation circuit can be driven stably and which also has a low power consumption, with a good yield.

Furthermore, it is preferable to use a field-effect transistor as each transistor. It is more preferable to use a field-effect transistor wherein the gate and drain thereof have been short-circuited.

An electronic circuit according to a fifth aspect of this invention comprises a constant-voltage generation circuit for outputting a predetermined constant voltage, and a crystal oscillation circuit that is driven to oscillate by the constant voltage supplied from the constant-voltage generation circuit. The temperature characteristics of the oscillation-stopped voltage of this crystal oscillation circuit and the constant voltage that is output from this constant-voltage generation circuit are set to be the same.

It is therefore possible to implement an electronic circuit that can drive a crystal oscillation circuit stably and at an even lower power consumption, by using the constant voltage that is output from the constant-voltage generation circuit to drive the crystal oscillation circuit.

The constant-voltage generation circuit may comprise at least one voltage-control transistor supplied with a predetermined constant current, for outputting at least one of the reference voltage and the comparison voltage for controlling the constant voltage to be output; and the constant current may be set to a value such that the total magnitude of voltage variation within a guaranteed operating temperature range of the voltage-control transistor is substantially the same as the magnitude of variation of the oscillation-stopped voltage within the guaranteed operating temperature range.

With this configuration, the value of the constant voltage that is output from the constant-voltage generation circuit can be set to a slightly higher value than the oscillation-stopped voltage of the crystal oscillation circuit, within the entire temperature range required as the operating environment of the crystal oscillation circuit. As a result, the crystal oscillation circuit can be driven for a long time both stably and with a low power consumption, whatever the temperature environment it may encounter.

The constant current may be set to a value such that the magnitude of voltage variation within a guaranteed operating temperature range of the first and second voltage-control transistors is one half the magnitude of variation of the oscillation-stopped voltage within the guaranteed operating temperature range.

This ensures that the value of the constant voltage that is output from the constant-voltage generation circuit is set to the minimum voltage that enables the crystal oscillation circuit to operate. Thus the crystal oscillation circuit can be driven for a long time both stably and with a low power consumption.

The absolute value of the constant voltage may be equal to or greater than the absolute value of the oscillation-stopped voltage of a crystal oscillation circuit supplied with the constant voltage.

The constant-current source used in the constant-voltage generation circuit is preferably fabricated to supply a constant current having a negative temperature characteristic. This makes it possible to avoid damage to the circuit by a too-large constant current that might otherwise occur when the ambient temperature rises.

A semiconductor device in accordance with this invention comprises the above described electronic circuit.

Electronic equipment in accordance with this invention comprises the above described electronic circuit or semiconductor device, and an operating reference signal is generated from the oscillation output of the crystal oscillation circuit.

A timepiece in accordance with this invention comprises the above described electronic circuit or semiconductor device, and a timepiece reference signal is generated from an oscillation output of the crystal oscillation circuit.

BEST MODE FOR CARRYING OUT THE INVENTION

Preferred embodiments of this invention will be described below with reference to the accompanying drawings.

First Embodiment

Figure 1:
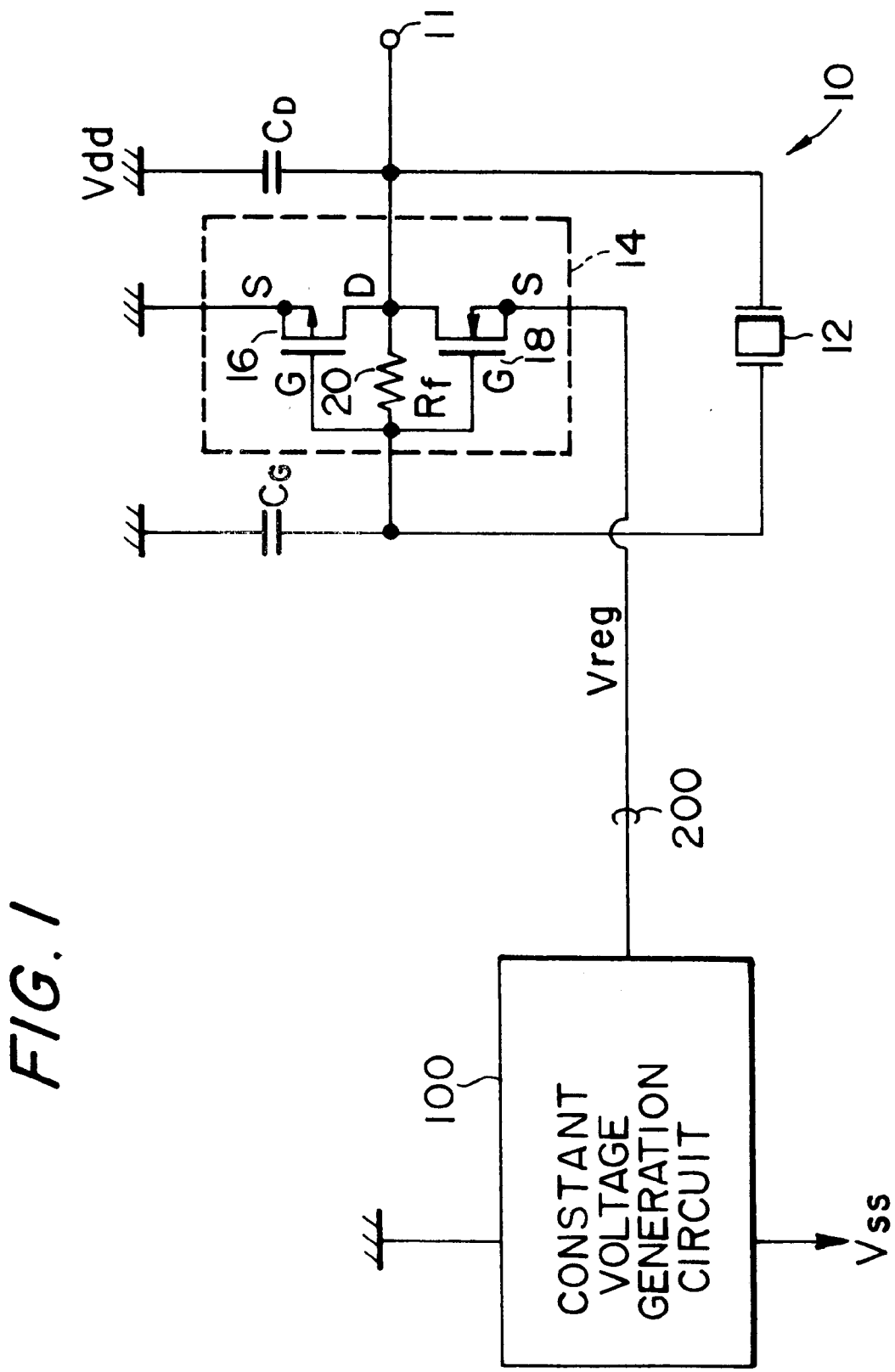
FIG. 1 is an illustrative view of a preferred first embodiment of an electronic circuit to which this invention is applied.

An example of an electronic circuit to which this invention is applied is shown in FIG. 1. The electronic circuit of this embodiment comprises a constant-voltage generation circuit 100, which outputs a constant voltage $V_{reg}$ over a signal output line 200, and a crystal oscillation circuit 10, which is driven by this constant voltage $V_{reg}$.

The crystal oscillation circuit 10 comprises a signal inversion amplifier 14 and a feedback circuit. This feedback circuit comprises a crystal oscillator 12, a resistor 20, and capacitors CD and CG for phase compensation, with the configuration being such that an output from the drain of the signal inversion amplifier 14 is phase-inverted by 180° and fed back to the gate of the signal inversion amplifier 14 as a gate input.

The signal inversion amplifier 14 comprises paired transistors: a p-type field-effect transistor (hereinafter abbreviated to "PMOSFET") 16 and an n-type field-effect transistor (hereinafter abbreviated to "NMOSFET") 18.

This signal inversion amplifier 14 is connected between a first potential side and a second potential side that is at a lower voltage, and is driven by a power supply delivered by the potential difference between these two potentials. In this case, the first potential is set to a ground potential $V_{dd}$ and the second potential is set to a negative constant voltage $V_{reg}$.

When the constant voltage $V_{reg}$ is applied to the signal inversion amplifier 14 in the crystal oscillation circuit 10 of the above configuration, a signal is output from the signal inversion amplifier 14, and that output signal is inverted through 180° and is fed back as an input to the gate thereof. This drives the PMOSFET 16 and the NMOSFET 18 of the signal inversion amplifier 14 to turn alternately on and off, which gradually increases the oscillation output of the crystal oscillation circuit 10 until the crystal oscillator 12 is driven to oscillate stably.

This causes an oscillation signal of a predetermined frequency to be output from an output terminal 11 of the crystal oscillation circuit 10.

To drive an electronic circuit comprising this crystal oscillation circuit 10 at a low power consumption, it is necessary to set the absolute value of the drive voltage $V_{reg}$ of the crystal oscillation circuit 10 to be as low as possible. It is known from experiments that the power consumption of the crystal oscillation circuit 10 is proportional to the square of the absolute value of the supplied voltage $V_{reg}$.

However, this crystal oscillation circuit 10 also has the oscillation-stopped voltage $V_{sto}$, and the crystal oscillation circuit 10 will stop oscillating if the absolute value of the supplied voltage $V_{reg}$ falls below the absolute value of the oscillation-stopped voltage $V_{sto}$.

It is therefore necessary to ensure that the constant voltage $V_{reg}$ supplied from the constant-voltage generation circuit 100 satisfies the following inequality, such that it is equal to or greater than the absolute value of the oscillation-stopped voltage $V_{sto}$, and also set it to be as small as possible:

$$|V_{reg}| \geq |V_{sto}| \qquad (1)$$

Semiconductor fabrication techniques are often used for making an electronic circuit comprising the above described constant-voltage generation circuit 100 and crystal oscillation circuit 10. It is therefore necessary to ensure that the constant-voltage generation circuit 100 can drive the crystal oscillation circuit 10 stably and also output a constant voltage $V_{reg}$ that keeps the power consumption as low as possible when the crystal oscillation circuit 10 is oscillating stably.

Figure 2:
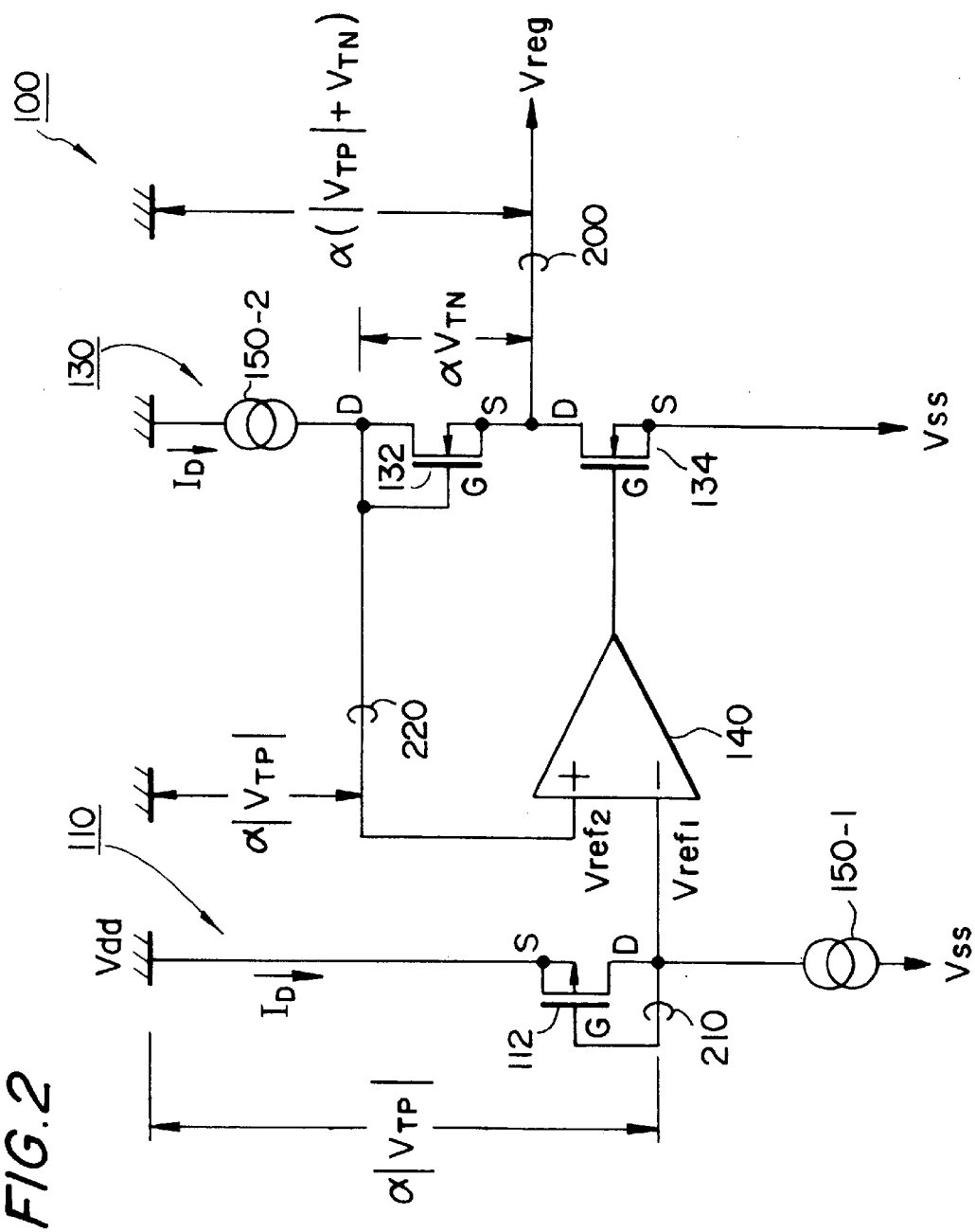
FIG. 2 is an illustrative view of an example of the constant-voltage generation circuit used in the electronic circuit of this first embodiment.

A specific circuit configuration of this constant-voltage generation circuit 100 is shown in FIG. 2.

The constant-voltage generation circuit 100 of this embodiment comprises a first voltage creation circuit 110, which generates a reference voltage $V_{ref1}$, and a second voltage creation circuit 130, which outputs the constant voltage $V_{reg}$ having a predetermined correlation with the reference-voltage $V_{ref1}$ from the output line 200. This constant-voltage generation circuit 100 is connected between a first potential side and a second potential side that is at a lower potential, and is driven by a power supply provided by the potential difference between these two potentials. In this case, the first potential is set to the ground potential $V_{dd}$ and the second potential is set to a predetermined power voltage $V_{ss}$. The absolute value of this power voltage $V_{ss}$ is equal to or greater than the absolute value of the constant voltage $V_{reg}$.

The first voltage creation circuit 110 comprises a first constant-current source 150-1, which supplies a constant current $I_D$ as shown by the arrow in the figure, and a p-type field-effect transistor (hereinafter abbreviated to "PMOSFET") 112, which is connected in series with the first constant-current source 150-1 and functions as a first voltage-control transistor.

The gate and drain of this voltage-control FET 112 are short-circuited. The source of this FET 112 is connected to the ground potential $V_{dd}$ side and the drain thereof is connected to the power source $V_{ss}$ side through the constant-current source 150-1 and also to a reference voltage output line 210.

This first voltage creation circuit 110 therefore generates between the source and drain of the FET 112 a potential difference of $\alpha|V_{TP}|$ that is dependent on the threshold voltage $V_{TP}$ of the FET 112, in accordance with the constant current $I_D$ flowing from the constant-current source 150-1. Therefore, the reference voltage $V_{ref1}$ is output to the output line 210 on the basis of the ground potential $V_{dd}$, as follows:

$$V_{ref1} = \alpha|V_{TP}| \qquad (2)$$

where $V_{TP}$ is the threshold voltage of the FET 112 and $\alpha$ is a predetermined coefficient.

The second voltage creation circuit 130 comprises a second constant-current source 150-2, which is connected in series between the ground potential $V_{dd}$ and the power source $V_{ss}$, an n-type field-effect transistor (hereinafter abbreviated to "NMOSFET") 132 that functions as a second voltage-control transistor, and an NMOSFET 134 that functions as an output transistor.

This constant-current source 150-2 is formed to supply the same constant current $I_D$ as that of the first constant-current source 150-1.

The gate and drain of the FET 132 are short-circuited. The drain of the FET 132 is connected to the ground potential $V_{dd}$ side through the second constant-current source 150-2 and the source thereof is connected to the output line 200.

The drain of the FET 134 that functions as an output transistor is connected to the output line 200 and the source thereof is connected to the power source $V_{ss}$ side.

In addition, the second voltage creation circuit 130 also comprises a signal inversion amplifier 140. A comparison signal $V_{ref2}$, which is output from a comparison signal output line 220 that is connected to the drain side of the FET 132, is input to a positive input terminal of the signal inversion amplifier 140, the reference voltage $V_{ref1}$ is input to a negative input terminal thereof, and the signal inversion amplifier 140 amplifies the difference between the two voltages $V_{ref2}$ and $V_{ref1}$ and feeds that output signal back as an input to the gate of the FET 134.

In this manner, feedback control is provided by the operation of the signal inversion amplifier 140 and the output FET 134 to ensure that the comparison voltage $V_{ref2}$ of the comparison signal output line 220 becomes the same as the reference voltage $V_{ref1}$ of the output line 210. In other words, the drain voltage $V_{ref2}$ of the voltage-control FET 132 becomes the value of $\alpha|V_{TP}|$, as follows:

$$V_{ref2} = \alpha|V_{TP}| \quad (3)$$

During this time, the constant current $I_D$ from the second constant-current source 150-2 flows through the FET 132, so that a potential difference $\alpha V_{TN}$ that is dependent on the threshold voltage $V_{TN}$ of the FET 132 is generated between the output lines 220 and 200.

As a result, the constant voltage $V_{reg}$ that is output between the output line 200 and the ground potential $V_{dd}$ is dependent on $(|V_{TP}|+V_{TN})$, as follows:

$$V_{reg} = \alpha(|V_{TP}|+V_{TN}) \quad (4)$$

where $V_{TN}$ is the threshold voltage of the FET 132.

With this configuration, the constant-voltage generation circuit 100 of this embodiment outputs the predetermined constant voltage $V_{reg}$ to the output line 200, enabling the driving of the crystal oscillation circuit 10.

The constant-voltage generation circuit 100 of this embodiment is characterized in that the value of the constant current $I_D$ supplied from the first and second constant-current sources 150-1 and 150-2 is set to a value that is within the saturated operating region of the FETs 112 and 132 which function as first and second control transistors. This makes it possible to ensure that the value of the constant voltage $V_{reg}$ that is output from the constant-voltage generation circuit 100 is not affected greatly by temperature changes.

The configuration that ensures this effect is described in more detail below.

Figure 3:
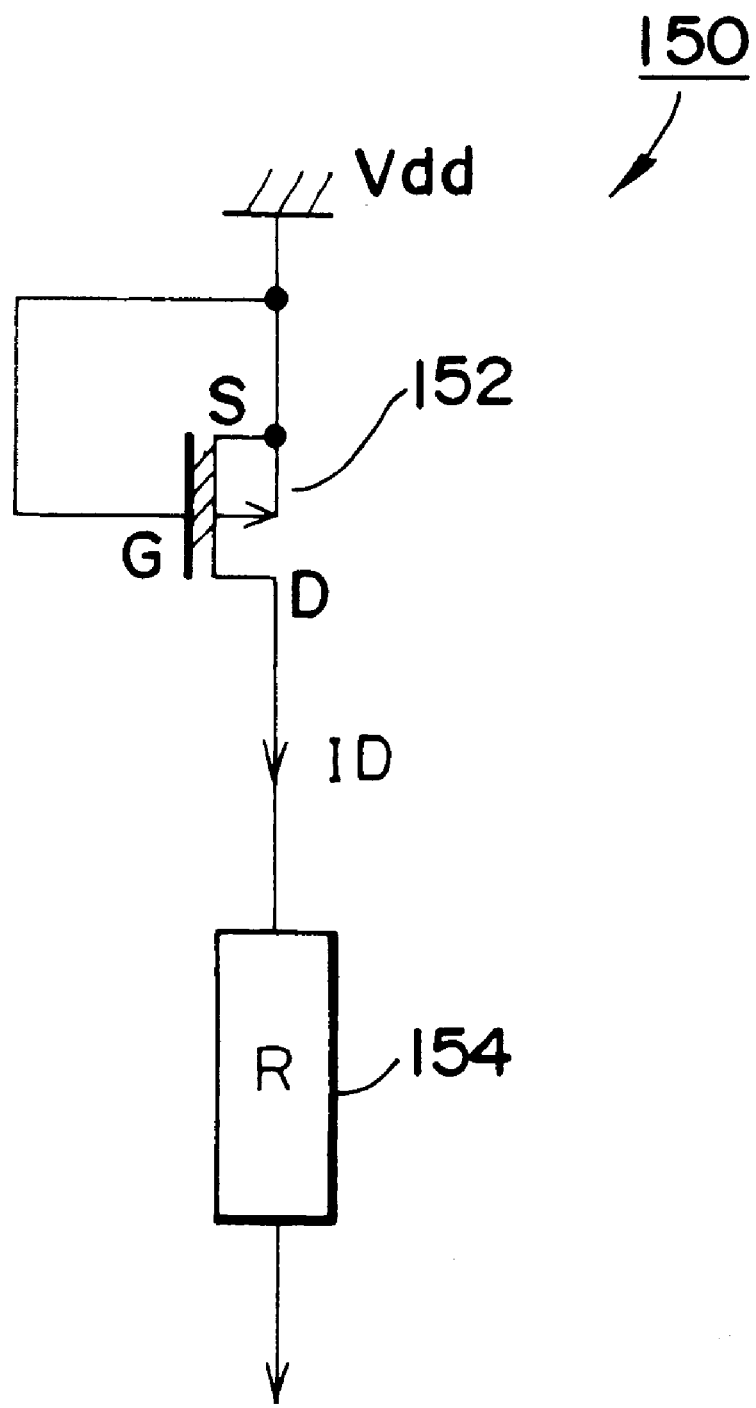
FIG. 3 is an illustrative view of an example of the constant-current source used in the constant-voltage generation circuit.

An example of the first and second constant-current sources 150-1 and 150-2 used in the constant-voltage generation circuit 100 of this embodiment is shown in FIG. 3. Note that the configuration of each of the constant-current sources 150-1 and 150-2 is the same, so only the configuration of the constant-current source 150-2 is shown here by way of example, and further description of the other constant-current source 150-1 is omitted.

The constant-current source 150 of this embodiment comprises a depletion type of PMOSFET 152 and a resistor 154.

The gate and source of this FET 152 are short-circuited, the source side thereof is connected to the ground potential $V_{dd}$, and the drain side thereof is connected to the resistor 154.

Figure 4:
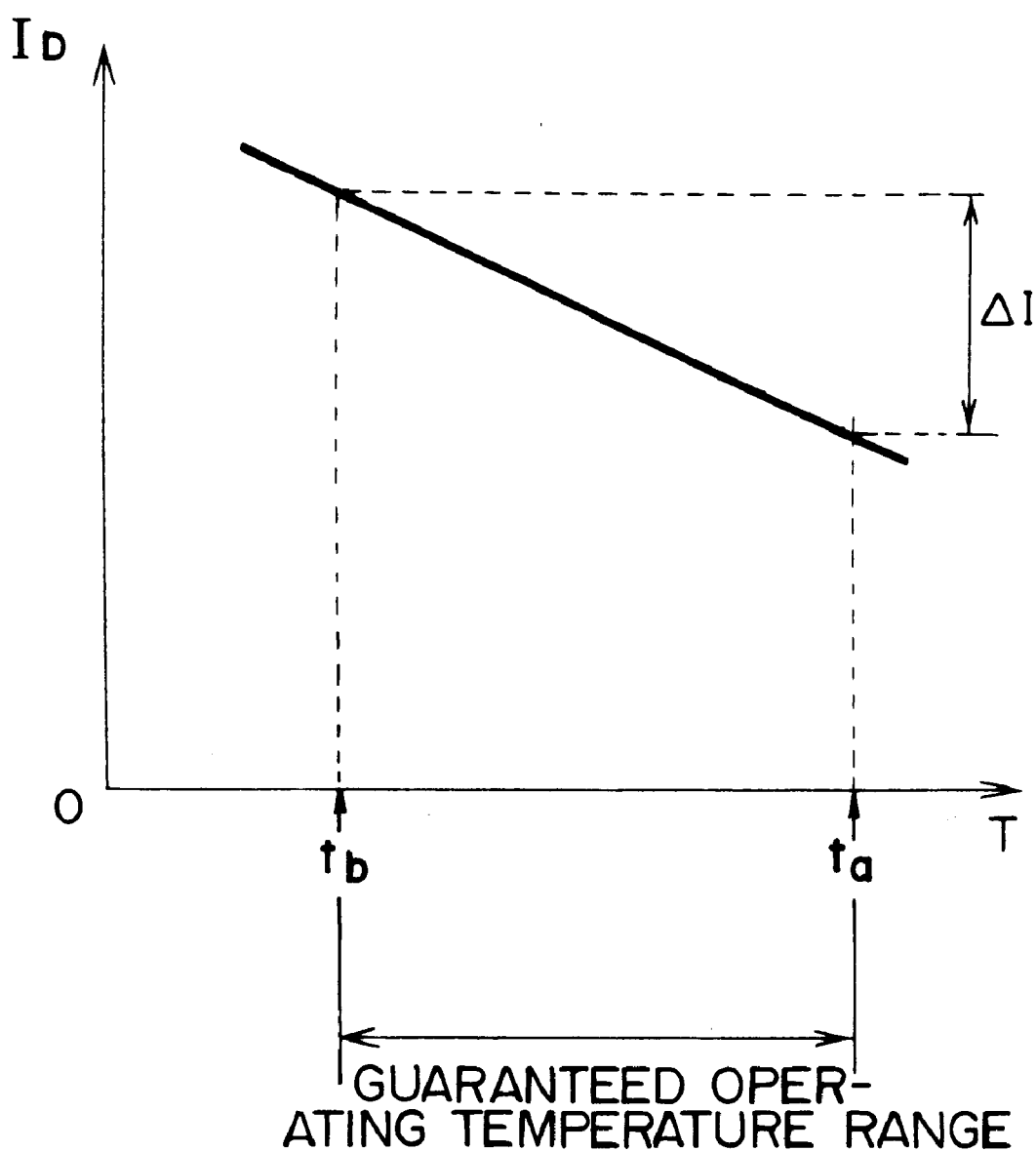
FIG. 4 is a graph illustrating the temperature characteristic of the constant current $I_D$ supplied from the constant-current source.

The thus configured constant-current source 150 operates with a negative temperature characteristic with respect to changes in temperature T, as shown in FIG. 4.

In this graph, $t_a$ and $t_b$ denote the upper and lower limits of the guaranteed operating temperature range required by the constant-current source 150 and the crystal oscillation circuit 10. In addition, $\Delta I$ denotes the range of current variations of the constant-current source 150 operating within this guaranteed range.

In this embodiment, the element layout and element fabrication conditions are set during the process of fabricating the FET 152 in each of the first and second constant-current sources 150-1 and 150-2, to ensure that dimensions such as the width and length of the gate and the impurity implantation concentration are the same. This ensures that both of the constant-current sources 150-1 and 150-2 are fabricated to have the same negative temperature characteristic, as shown in FIG. 4.

Figure 5:
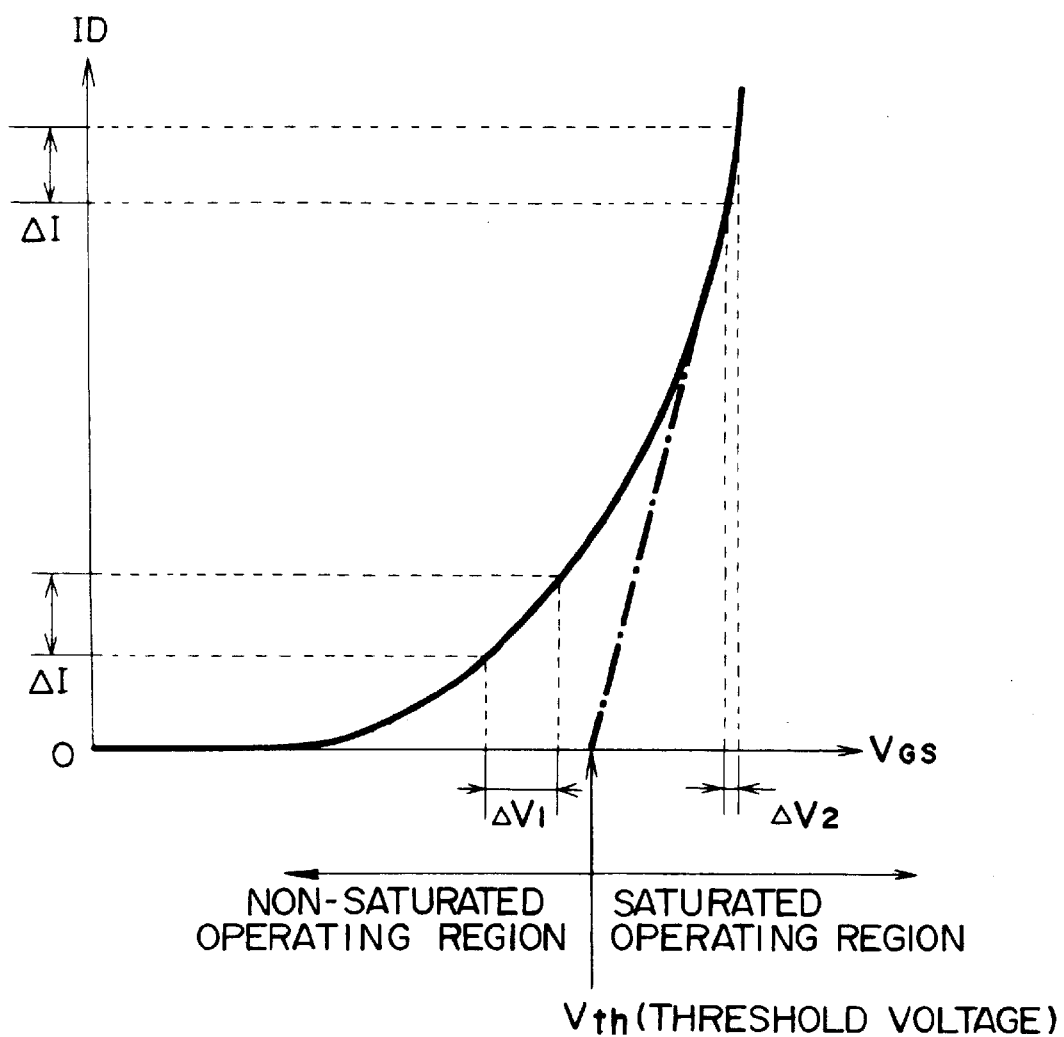
FIG. 5 is a graph illustrating the relationship between the constant current supplied from the constant-current source and the voltage $V_{GS}$ between the gate and source of the FET used as a voltage-control transistor.

The relationship between the voltage $V_{GS}$ between the gate and source of the FETs 112 and 132 used as the first and second voltage-control transistors and the constant current $I_D$ flowing therethrough is shown in FIG. 5.

This graph shows that, if the value of the constant current $I_D$ that is supplied to each of the FETs 112 and 132 is varied, the voltage between the gate and source thereof (in other words, the value of $\alpha|V_{TP}|$ or $\alpha|V_{TN}|$) also varies.

As shown in FIG. 4, the value of the constant current $I_D$ supplied from each constant-current source 150 varies only as far as $\Delta I$ within the guaranteed operating temperature range. Therefore, if the FETs 112 and 132 are made to operate in the non-saturated operating region at the threshold voltage $V_{th}$ or below, the magnitude of variation of $V_{GS}$ is a large value indicated by $\Delta V_1$.

In contrast thereto, the magnitude of variation of $V_{GS}$ can be set to an extremely small value $\Delta V_2$, regardless of the variations $\Delta I$ in the constant current $I_D$ caused by temperature changes, by setting the value of the current $I_D$ supplied from each constant-current source 150 to within the saturated operating region of the FETs 112 and 132.

Therefore, the constant current $I_D$ supplied from the constant-current sources 150-1 and 150-2 in the constant-voltage generation circuit 100 of this embodiment is set to within the saturated operating region of the FETs 112 and 132. This ensures the output of the constant voltage $V_{reg}$ which is not affected greatly by temperature changes, thus making it possible to drive the crystal oscillation circuit 10 stably.

Note that the constant-current source 150 used in the constant-voltage generation circuit 100 of this embodiment is not limited to the configuration shown in FIG. 3, and thus it can have any other configuration as necessary.

The constant voltage $V_{reg}$, which is not affected greatly by temperature changes as described above, is supplied from the constant-voltage generation circuit 100 of this embodiment. It is therefore possible to efficiently prevent the occurrence of a state in which the effects of temperature changes cause the absolute value of this constant voltage $V_{reg}$ to fall below the absolute value of the oscillation-stopped voltage $V_{sto}$ and thus halt the oscillation, even if the absolute value of the constant voltage $V_{reg}$ has been set to be equal to or greater than the absolute value of the oscillation-stopped voltage $V_{sto}$ to and has also been set to a magnitude that satisfies the necessary minimum limit.

The relationship between the constant voltage and the oscillation-stopped voltage will now be described in more detail.

First of all, the oscillation-stopped voltage $V_{sto}$ of the crystal oscillation circuit 10 is expressed as follows:

$$|V_{sto}| = K(|V_{thp}|+V_{thn}) \quad (5)$$

where $V_{thp}$ and $V_{thn}$ are the threshold voltages of the FETs 16 and 18, respectively, and K is between 0.8 and 0.9.

Thus the oscillation-stopped voltage $V_{sto}$ is obtained as a value that is proportional to the sum of the threshold voltages of the FETs 16 and 18. This means that the oscillation-stopped voltage $V_{sto}$ is affected by the temperature characteristics of the threshold voltages of the FETs 16 and 18.

The constant voltage $V_{reg}$ that is output from the constant-voltage generation circuit 100 also has a negative temperature characteristic, as described previously.

It is therefore important to ensure that the temperature characteristics of the two voltages $V_{sto}$ and $V_{reg}$ are the same, from the viewpoint of driving the crystal oscillation circuit 10 stably at a low power level.

In the electronic circuit of this embodiment, the temperature characteristic of the constant voltage $V_{reg}$ supplied from the constant-voltage generation circuit 100 can be made the same as the temperature characteristic of the oscillation-stopped voltage $V_{sto}$. A configuration that enables this is described below.

Figure 6:
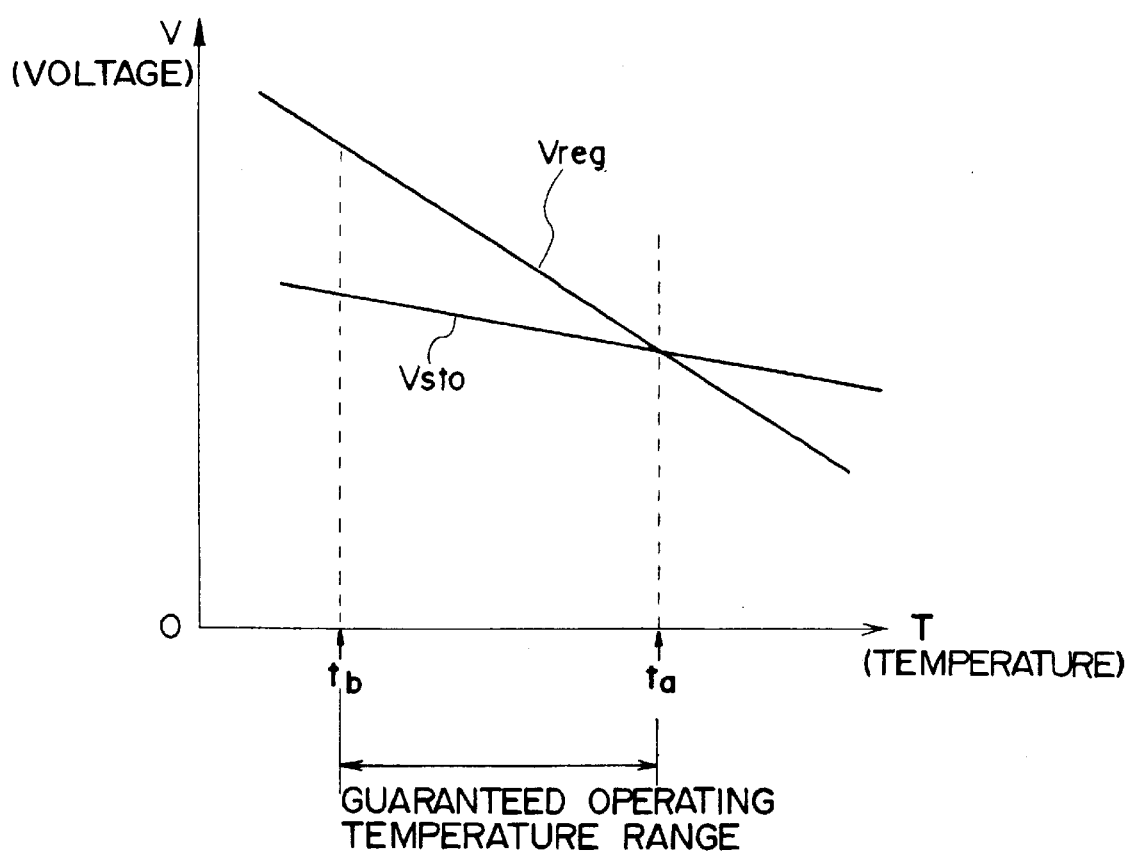
FIG. 6 is a graph illustrating the temperature characteristics of the constant voltage $V_{reg}$ that is output from the constant-voltage generation circuit and the oscillation-stopped voltage $V_{sto}$ of the crystal oscillation circuit.

An example of different temperature characteristics for the constant voltage $V_{reg}$ and the oscillation-stopped voltage $V_{sto}$ is shown in FIG. 6. In this graph, temperature is plotted along the horizontal axis and voltage is plotted along the vertical axis.

Based on these temperature characteristics, the condition $V_{reg} > V_{sto}$ must be satisfied at the upper limit $t_a$ of the guaranteed operating temperature range, in order to ensure the condition defined by Inequality (1) above.

However, if this condition is set, the absolute value of the constant voltage $V_{reg}$ at the minimum temperature $t_b$ of this guaranteed range is larger than necessary with respect to the oscillation-stopped voltage $V_{sto}$. As a result, a problem arises in that the crystal oscillation circuit 10 consumes power in a wasteful manner.

Figure 7:
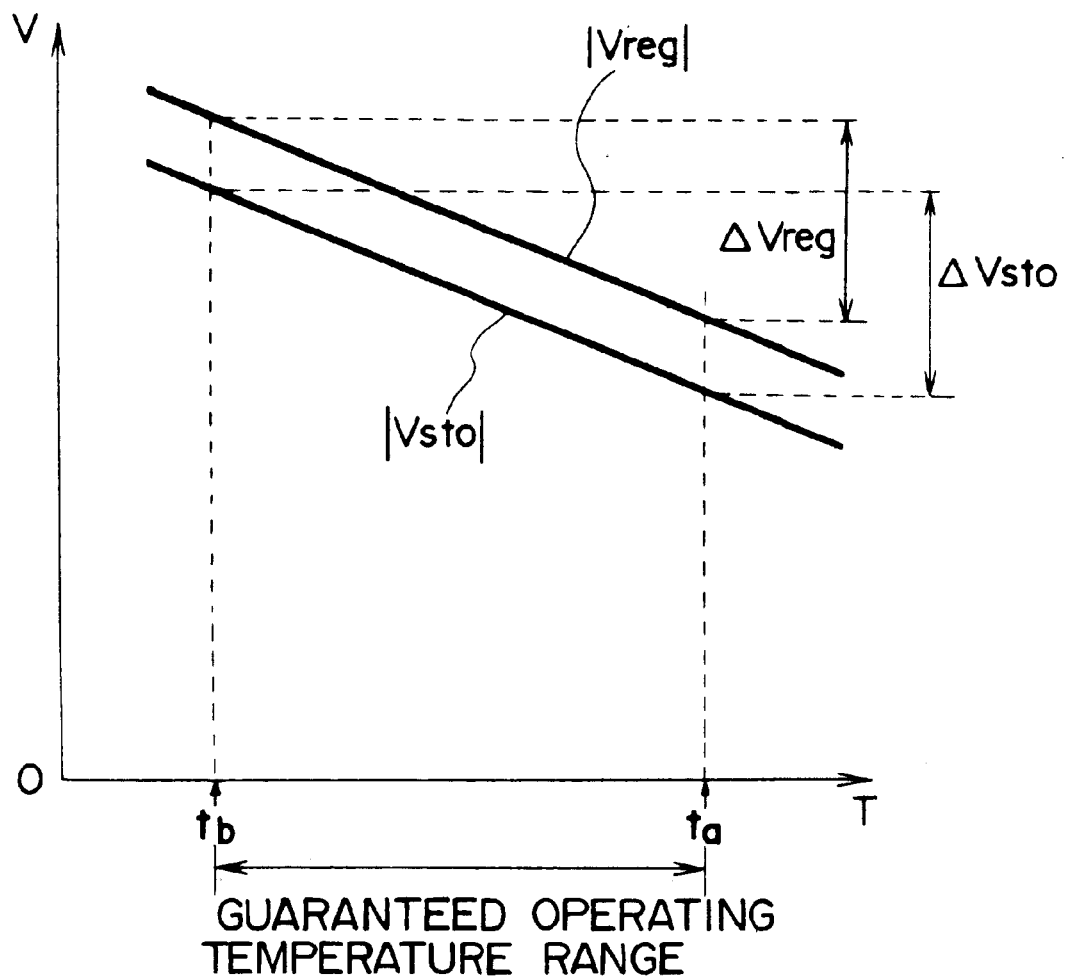
FIG. 7 is a graph illustrating an example in which the temperature characteristics of the constant voltage $V_{reg}$ and the oscillation-stopped voltage $V_{sto}$ are the same.

In contrast thereto, the circuit of this embodiment can be driven at a low power consumption because the constant voltage $V_{reg}$ and the oscillation-stopped voltage $V_{sto}$ can be shaped to have the same temperature characteristic, as shown in FIG. 7.

That is to say, the crystal oscillation circuit 10 of this embodiment is fabricated in such a manner that the FETs 16 and 18 of the signal inversion amplifier 14 operate in the saturated operating region. This ensures that the voltage $V_{GS}$ between the gate and source of each of the FETs 16 and 18 has a characteristic that is similar to that in the saturated operating region of the FETs 112 and 132, as shown in FIG. 5.

In other words, the temperature coefficient of $\alpha$ and K can be made substantially equal in Equations (4) and (5) for deriving the constant voltage $V_{reg}$ and the oscillation-stopped voltage $V_{sto}$. As a result, the constant voltage $V_{reg}$ and the oscillation-stopped voltage $V_{sto}$ can be made to have the same negative temperature coefficient, as shown in FIG. 7.

In this case, the FETs 16, 18, 112, and 132 are preferably fabricated as transistors of the same dimensions.

As described above, this embodiment makes it possible to output a stabilized constant voltage $V_{reg}$ from the constant-voltage generation circuit 100, by driving the voltage-control transistors 112 and 132 of the constant-voltage generation circuit 100 at the constant current $I_D$ in the saturated operating region.

In addition, this embodiment makes it possible to ensure that the temperature characteristic of the oscillation-stopped voltage $V_{sto}$ is the same as the temperature characteristic of the constant voltage $V_{reg}$ that is output from the constant-voltage generation circuit 100, by a configuration that ensures that the FETs 16 and 18 forming the signal inversion amplifier 14 of the crystal oscillation circuit 10 are driven in the saturated operating region.

This makes it possible to set the constant voltage $V_{reg}$ to a minimum that satisfies Inequality (1) over the entire guaranteed operating temperature range of the circuit, as shown in FIG. 7, and, as a result, drive the crystal oscillation circuit 10 optimally at a voltage of the necessary minimum level.

Modification

A modification of the first embodiment will now be described.

Figure 8:
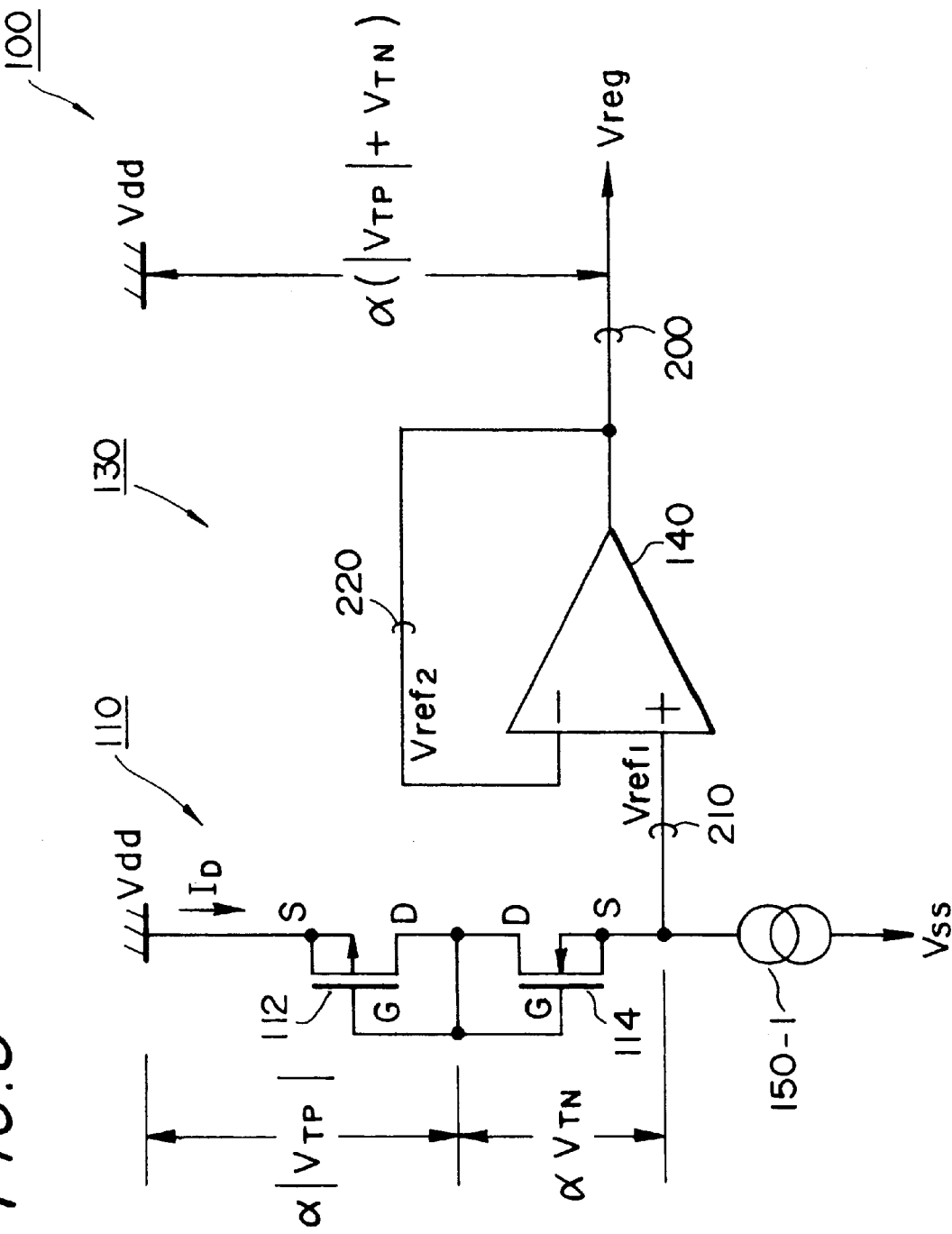
FIG. 8 is an illustrative view of a modification of the constant-voltage generation circuit used in the electronic circuitry of FIG. 1.

The above embodiment was described by way of example as using two constant-current sources 150-1 and 150-2, but the present invention is not limited thereto and the constant-voltage generation circuit 100 could equally well be configured in other ways, such as that shown in FIG. 8.

In this constant-voltage generation circuit 100, the second voltage creation circuit 130 comprises the signal inversion amplifier 140 and the line 220 that feeds the output of that signal inversion amplifier 140 unchanged back to the negative terminal thereof as the comparison voltage $V_{ref2}$. The output voltage of the signal inversion amplifier 140 is output unchanged as the constant voltage $V_{reg}$ from the output line 200.

This means that the value of the constant voltage $V_{reg}$ that is output from the output line 200 is the same as the value of the reference voltage $V_{ref1}$ that is input to the positive terminal of the signal inversion amplifier 140.

In order to create this reference voltage, a plurality of voltage-control transistors of the first voltage creation circuit 110 are connected in series between a reference potential $V_{dd}$ side and the line 210. In this case, the PMOSFET 112 and the NMOSFET 114 are used. The gate and drain of each of these FETs 112 and 114 are short-circuited. In addition, the drain terminals of these FETs 112 and 114 are connected together.

The above described configuration ensures that a voltage given by the following equation is output as the reference voltage from the first voltage creation circuit 110:

$$V_{ref1} = \alpha(|V_{TP}| + V_{TN}) \tag{6}$$

Therefore, a constant voltage $V_{reg}$ having the same value as that of the first embodiment is output from the constant-voltage generation circuit 100.

During this time, the constant current $I_D$ supplied to the FETs 112 and 114 is set to a value within the saturated operating region of the FETs 112 and 114, even in the circuit shown in FIG. 8. This makes it possible to achieve operational effects that are similar to those of the above embodiment.

Second Embodiment

Figure 9:
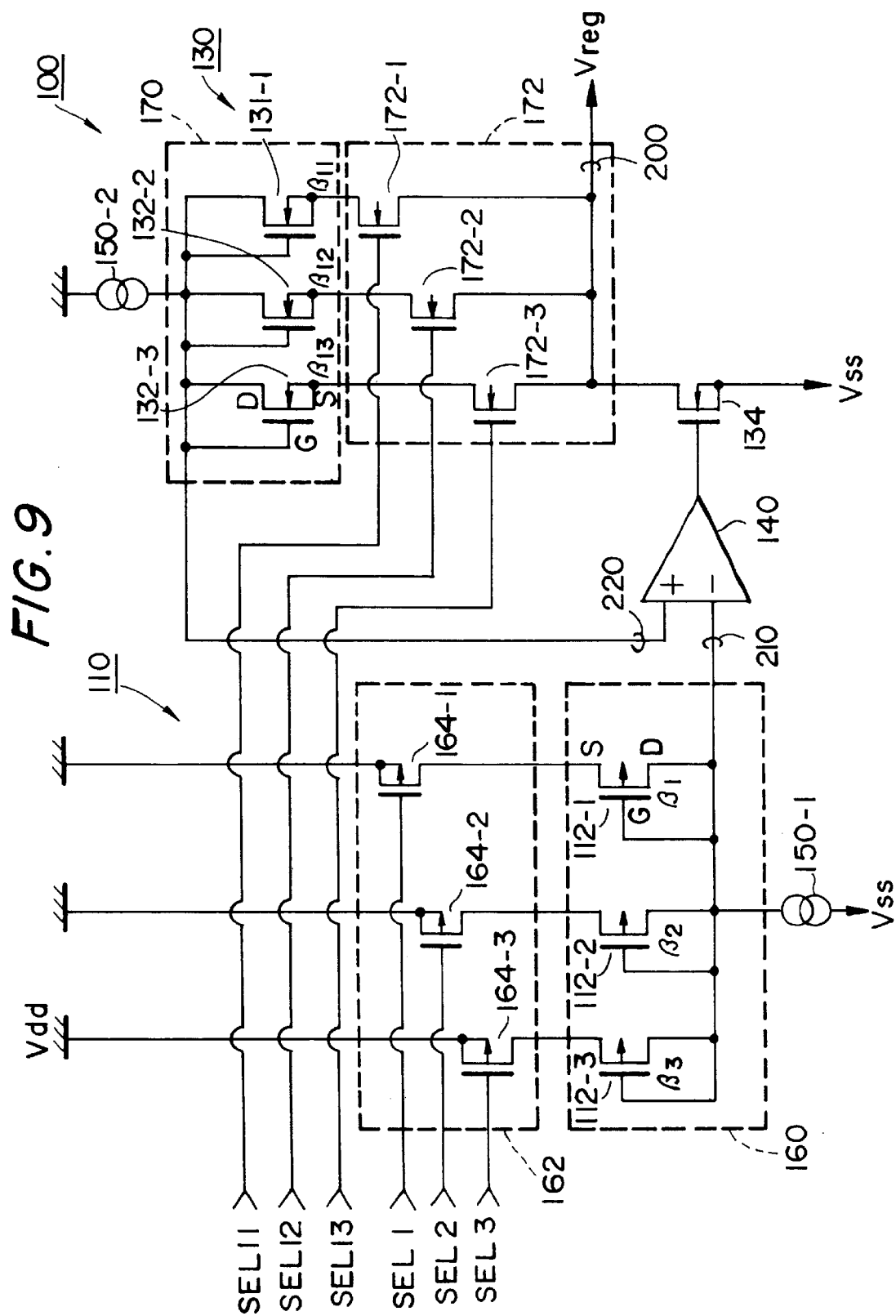
FIG. 9 is an illustrative view of a preferred second embodiment of the constant-voltage generation circuit used in the electronic circuitry of this invention.

A second embodiment of the constant-voltage generation circuit 100 to which this invention is applied is shown in FIG. 9. Note that components that correspond to those of the previous embodiment are denoted by the same symbols and further description thereof is omitted.

A first feature of the constant-voltage generation circuit 100 of this embodiment lies in the provision of a plurality of transistors with different values of the current amplification ratio $\beta$ as the first voltage-control transistor, wherein one transistor from this plurality of transistors is selected for use as the first voltage-control transistor 112.

Another feature of this embodiment lies in the provision of a plurality of transistors with different values of the current amplification ratio $\beta$, wherein one transistor from this plurality of transistors is selected for use as the second voltage-control transistor 132.

This makes it possible to select a combination of transistors having optimal current amplification ratios as the first and second voltage-control transistors 112 and 132. Thus the value of the constant voltage that is output on the basis of Equation (4) can be adjusted even more finely. In other words, the absolute value of the constant voltage $V_{reg}$ can be set to as small a value as possible within a range wherein Inequality (1) is satisfied, making it possible to reduce the power consumption of the entire circuitry even further.

This configuration will now be described in more detail.

The constant-voltage generation circuit 100 of this embodiment has a first FET group 160 comprising a plurality of PMOSFETs 112-1, 112-2, and 112-3 with mutually different current amplification ratios $\beta_1$, $\beta_2$, and $\beta_3$, together with a first selection circuit 162 comprising a plurality of switching FETs 164-1, 164-2, and 164-3 for selecting any desired FET 112 from the first FET group 160 to enable its use.

The gate and drain of each of the FETs 112 in the first FET group 160 are short-circuited, and the drain sides thereof are all connected to the constant-current source 150-1.

The switching FETs 164-1, 164-2, and 164-3 are connected in series between the corresponding FETs 112-1, 112-2, and 112-3 and the ground potential $V_{dd}$. One of these FETs 164-1, 164-2, and 164-3 is turned on by a selection signal SEL applied to the gate thereof, which selects the corresponding FET 112 and makes it ready for use.

In this case, the current amplification ratios $\beta$ of the FETs 112-1, 112-2, and 112-3 are set to satisfy the following inequality:

$$\beta_1 < \beta_2 < \beta_3 \quad (7)$$

Figure 10:
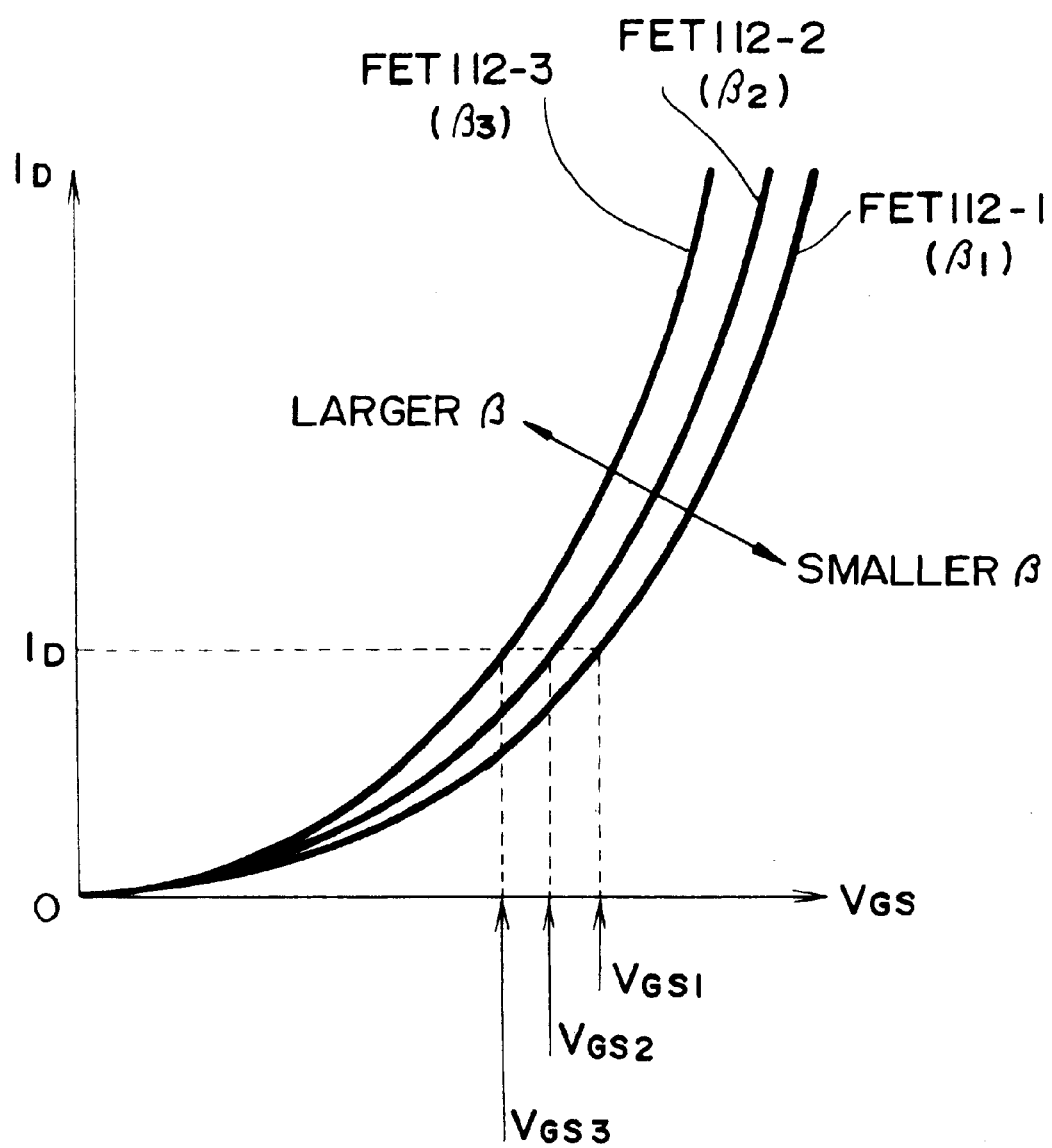
FIG. 10 is a graph illustrating the relationship between the constant current $I_D$ and the voltage $V_{GS}$ between the gate and source of the voltage-control transistor used in the constant-voltage generation circuit of the second embodiment, with the current amplification ratios of FETs expressed as parameters.

The relationship between the voltage $V_{GS}$ between the gate and source of each of the FETs 112-1, 112-2, and 112-3 and the current $I_D$ flowing therethrough is shown in FIG. 10.

As shown in this graph, when the same current $I_D$ flows therethrough, the voltage $V_{GS}$ between the gate and source decreases as the current amplification ratio $\beta$ of the FET increases. In this case, the voltage $V_{GS}$ between the gate and source of each FET 112 is expressed as follows:

$$V_{GS} = \alpha V_{TP} \quad (8)$$

This voltage between gate and source is part of the constant voltage $V_{reg}$, as is clear from Equation (4).

Therefore, the selection circuit 162 can be used to finely adjust the value of the constant voltage $V_{reg}$ that is output from the constant-voltage generation circuit 100 by selecting the FET 112 that has a suitable current amplification ratio $\beta$.

A second FET group 170 comprises a plurality of NMOS-FETs 132-1, 132-2, and 132-3 having mutually different current amplification ratios $\beta_{11}$, $\beta_{12}$, and $\beta_{13}$. The gate and drain of each of these FETs 132-1, 132-2, and 132-3 are short-circuited, and the drain sides thereof are connected to the second constant-current source 150-2.

A second selection circuit 172 comprises a plurality of switching FETs 172-1, 172-2, and 172-3, and these FETs 172-1, 172-2, and 172-3 are connected between the sources of the corresponding FETs 132-1, 132-2, and 132-3 and the output line 200.

When the same constant current $I_D$ flows through the plurality of FETs 132-1, 132-2, and 132-3, the voltage $V_{GS}$ between the gate and source decreases as the current amplification ratio $\beta$ of the FET increases, in a manner similar to that of the first FET group 160. In this case, the current amplification ratios $\beta$ of the FETs 172 are set to satisfy the following inequality:

$$\beta_{11} < \beta_{12} < \beta_{13} \quad (9)$$

Therefore, one of the FETs 132 can be set to function as the second voltage-control transistor by using selection signals SEL11 to SEL13 to turn on the corresponding switching FET 172.

In this case, the voltage $V_{GS}$ between the gate and source of the selected FET 132 is expressed as follows:

$$V_{GS} = \alpha V_{TN} \quad (10)$$

This means that the second selection circuit 172 can be used to finely adjust the value of the constant voltage $V_{reg}$ that is to be output, by selecting the FET 132 that has a suitable current amplification ratio $\beta$, as is clear from Equation (4).

In particular, the constant-voltage generation circuit 100 of this embodiment makes it possible to select transistors, each having desired current amplification ratios $\alpha$, from the first FET group 160 and the second FET group 170 to be the first and second voltage-control transistors 112 and 132, so that the value of the constant voltage $V_{reg}$ to be output can be adjusted even more finely by combining the current amplification ratio of the transistors 112 and 132.

In other words, the value of the constant voltage $V_{reg}$ can be finely adjusted in such as manner that the absolute value of the constant voltage $V_{reg}$ can be increased by selecting FETs 112 and 132 with smaller current amplification ratios $\beta$, or the absolute value of the constant voltage $V_{reg}$ can be decreased by selecting FETs 112 and 132 with larger current amplification ratios $\beta$, as is clear from Equation (4).

In this case, the layout of the FETs 112-1, 112-2, 112-3, 132-1, 132-2, and 132-3 can be designed with components having various different gate widths and lengths to match the current amplification ratio $\beta$, and thus the configuration can be based on the designed layout.

In this embodiment, the differences between the current amplification ratios $\beta1$ and $\beta2$ and between the current amplification ratios $\beta2$ and $\beta3$ are each set to be between approximately 2 to 5 times. Similarly, the differences between the current amplification ratios $\beta11$ and $\beta12$ and between the current amplification ratios $\beta12$ and $\beta13$ are each set to be between approximately 2 to 5 times As described above, the circuit of this embodiment uses a configuration in which suitable transistors are selected from a plurality of transistors having different current amplification ratios $\beta$, and those transistors are used as the first and second voltage-control transistors 112 and 132. This makes it possible to adjust the value of the constant voltage $V_{reg}$ that is to be output in an even finer manner than in a circuit provided with a plurality of transistors with different threshold voltages, wherein suitable transistors are selected therefrom for use as the first and second voltage-control transistors.

That is to say, adjustment of the threshold voltages of FETs is limited to approximately 0.1 Volts by the semiconductor fabrication process.

In contrast thereto, the current amplification ratios $\beta$ of FETs can be set to any desired values by varying the W/L dimensions, where W is the gate width of an FET and L is the length thereof.

That is why this embodiment makes it possible to enable even finer adjustment of the value of the constant voltage $V_{reg}$ to be output, by providing a plurality of FETs with different current amplification ratios $\beta$, then use an FET therefrom that has a suitable current amplification ratio $\beta$ as a voltage-control FET.

Note that the embodiment shown in FIG. 9 was described as involving a selection of each of the first voltage-control FET 112 and the second voltage-control FET 132 from corresponding pluralities of transistors, by way of example, but the present invention is not limited thereto and thus a configuration could be used in which only one of these voltage-control FETs is selected from a plurality of transistors with different current amplification ratios. For example, the configuration could be such that only the first FET group 160 or the second FET group 170 is provided, and only one of the FETs 112 and 132 is selected for use from that plurality of transistors with different current amplification ratios.

In addition, the constant-voltage generation circuit 100 of this embodiment has a configuration in which the first and second constant-current sources 150-1 and 150-2 each set the value of the constant current $I_D$ to be supplied to within the saturated operating region of the corresponding voltage-control FETs 112 and 132. Since this makes it possible to add the operational effects of the second embodiment to the operational effects of the first embodiment, it is possible to adjust the value of the constant voltage $V_{reg}$ even more finely than with the above first embodiment, enabling lower power consumptions for the entire circuitry.

The characteristic structure of this second embodiment can also be applied to the constant-voltage generation circuit 100 shown in FIG. 8. In such a case, the configuration could be such that the FET 112 is selected for use from the first FET group 160 and the FET 114 is selected for use from the second FET group 170. Such a configuration would make is possible to adjust the constant voltage $V_{reg}$ to be output in an even finer manner, in a similar manner to the second embodiment.

Selection Signal SEL Creation Method

The description now turns to the method of creating the selection signals.

Figure 11:
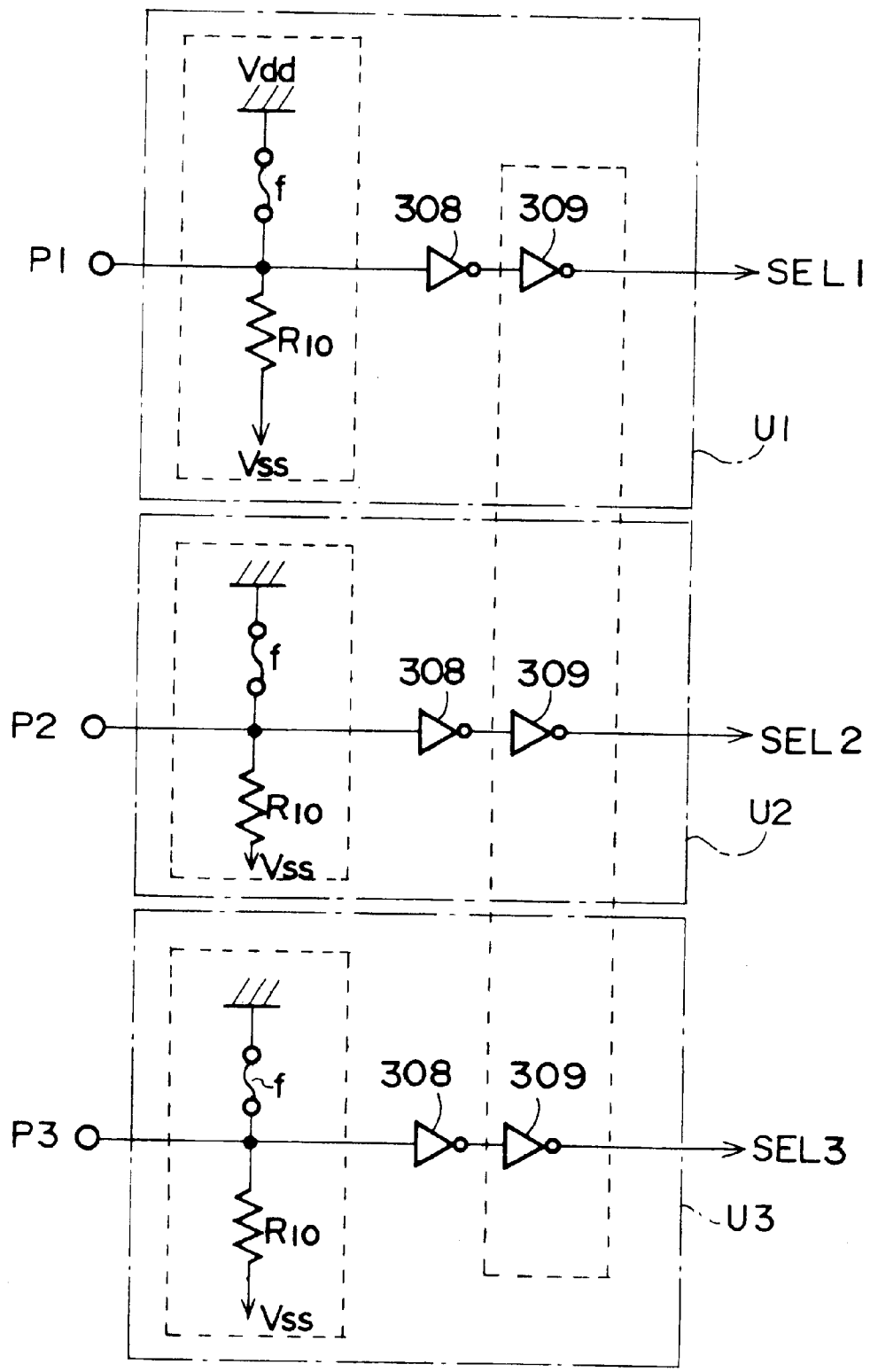
FIG. 11 is an illustrative view of a circuit for outputting signals for selecting FETs having different current amplification ratios.

A circuit for creating these selection signals SEL is shown in FIG. 11, where a plurality of these circuits is provided to correspond to selection signals SEL1, SEL2, ... SEL13. To simplify the description, this figure shows only three unit circuits U1, U2, and U3 that are provided to correspond to three selection signals SEL1 to SEL3, and further description thereof is omitted. Note that, since each of these unit circuits U has basically the same structure, the same symbols are used therein and further description thereof is omitted.

Each unit circuit U has a corresponding pad P, and that pad P is connected to the ground potential $V_{dd}$ side through a fuse f and to the power source potential $V_{ss}$ side through a resistor R10. The potential of the pad P is input to the gate of a corresponding FET as a selection signal SEL, through signal inversion amplifiers 308 and 309.

In this case, to ensure that a selection signal for controlling the on-state of the corresponding FET 164 is output, a high voltage is applied to the pad P to cut the fuse f, and that potential remains off subsequently. This switches the potential of the pad P from the ground potential $V_{dd}$ side to $V_{ss}$ side, so that the selection signal that is output from that unit circuit U functions to control the turning on of the corresponding FET 164.

Figure 12A:
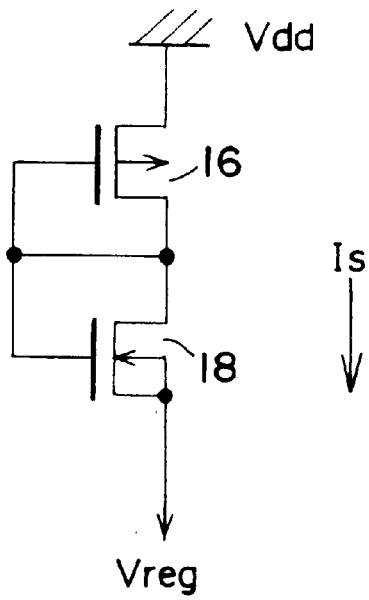
FIG. 12A is an illustrative view of the measurement of the short-circuit current $I_S$ of a crystal oscillation circuit and FIG. 12B is a graph illustrating the relationship between the measured short-circuit current $I_S$ and the oscillation-stopped voltage.
Figure 12B:
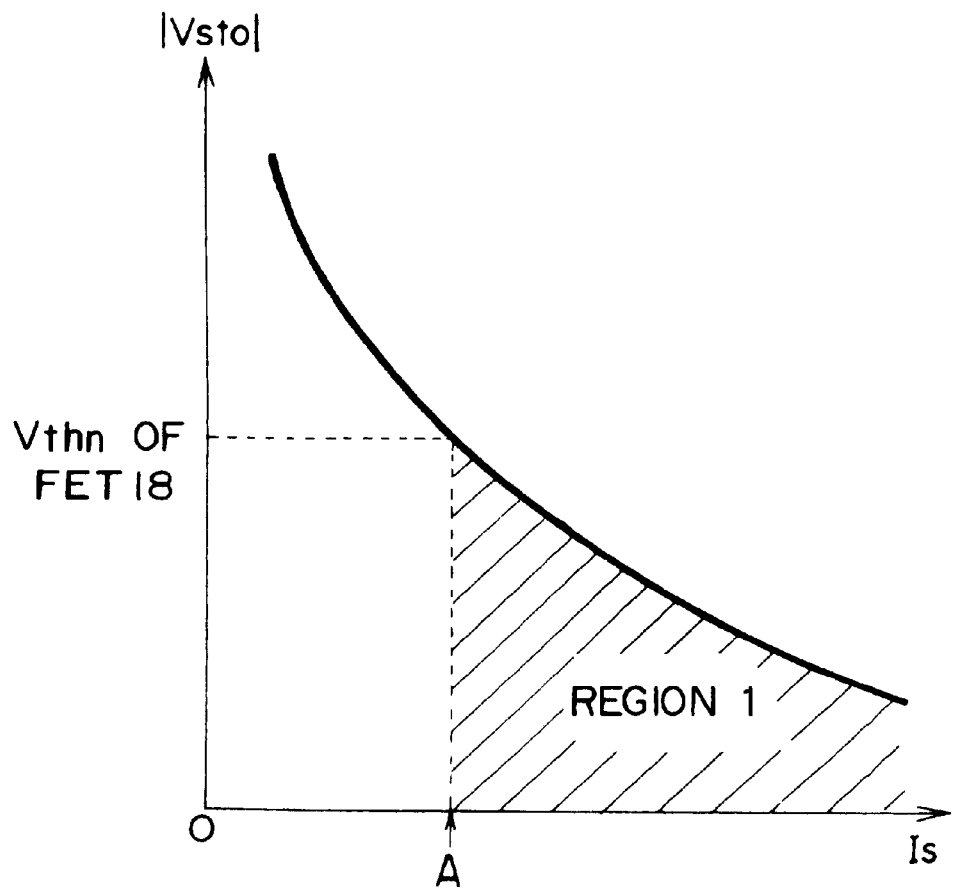

The method of measuring the short-circuit current $I_S$ flowing in the signal inversion amplifier 14 of the crystal oscillation circuit is shown in FIG. 12A and the relationship between the measured short-circuit current $I_S$ and the oscillation-stopped voltage $V_{sto}$ is shown in FIG. 12B.

As can be seen from FIG. 12A, the voltage $V_{reg}$ that is output from the ground potential $V_{dd}$ and the constant-voltage generation circuit 100 is applied to the signal inversion amplifier 14 in a state in which the common gate and common drain of the FETs 16 and 18 are short-circuited. The current flowing between $V_{dd}$ and $V_{reg}$ during this time is measured as the short-circuit current $I_S$.

It has been mentioned previously that the absolute value of the constant voltage $V_{reg}$ that is output from the constant-voltage generation circuit 100 must be set to be equal to or greater than the absolute value of the oscillation-stopped voltage $V_{sto}$ and also to be as small as possible.

Therefore, different combinations of the transistors 112 and 132 are selected sequentially, and the values of the short-circuit current $I_S$ flowing during each test and the values of the voltages output from the line 200 thereby are measured. A voltage $V_{reg}$, which can supply a short-circuit current $I_S$ that is equal to or larger than the ON-state current to the FET 16 of the signal inversion amplifier 14 and also ensure that the oscillation of the crystal oscillation circuit 10 is maintained, is detected. The combination of FETs 112 and 132 for supplying this constant voltage $V_{reg}$ is thus specified.

After this specification has been completed, the fuse f of the corresponding unit circuit U is cut and the specified FETs can be set so that they are used as the first voltage-control transistor 112 and the second voltage-control transistor 132.

This measurement of the short-circuit current $I_S$ and selection of the FETs 112 and 132 to be used is done during the process of inspecting the IC, but before the crystal oscillator 12 is mounted on the substrate. This process can be done by using a test circuit and a test pad connected to that test circuit (not shown in the figures).

This IC test is performed with the circuitry still in the wafer state. The short-circuit current is measured and the voltage output to the output line 200 is measured for each IC chip, using the test circuit and test pad provided within that IC chip. During this testing, only the signal inversion amplifier 14 and the constant-voltage generation circuit 100 are active; the other components are in a non-active state.

The above configuration makes it possible to form the constant-voltage generation circuit 100 so that it outputs the constant voltage $V_{reg}$ having an absolute value that is at least as great as the oscillation-stopped voltage of the crystal oscillation circuit 10 but is also at the necessary minimum limit, during the fabrication of the IC. This makes it possible to increase the yield of semiconductor devices.

Other Embodiments

Note that the descriptions of the above embodiments were based on the assumption that the temperature characteristics for the constant voltage $V_{reg}$ and the oscillation-stopped voltage $V_{sto}$ were made the same, as shown in FIG. 7, by setting the value of the constant current $I_D$ supplied from the constant-current sources 150-1 and 150-2 to be within the saturated operating region of the FETs 112 and 132 that function as voltage-control transistors.

However, it should be obvious that this invention is not limited thereto and other methods could be used for making the temperature characteristics of $V_{reg}$ and $V_{sto}$ the same, such as that described below.

For instance, if the constant-voltage generation circuit 100 of FIG. 2 is taken by way of example, the value of the constant voltage $V_{reg}$ that is output from the constant-voltage generation circuit 100 is given by Equation (4).

In addition, it can be understood from Equations (8) and (10) that the value of this constant voltage $V_{reg}$ is given by the sum of the voltages $V_{GS}$ between the gate and source of each of the voltage-control FETs 112 and 132.

Therefore, if the sum of the magnitudes of variations $\Delta V_{GS}$ of the voltage between the gate and source of each of the FETs 112 and 132 ($\Delta V_{reg}$) within the guaranteed operating temperature range shown in FIG. 7 is set to match the sum of the magnitudes of variations $\Delta V_{sto}$ of the oscillation-stopped voltage $V_{sto}$ within that guaranteed operating temperature range, the temperature coefficients of $V_{reg}$ and $V_{sto}$ can be made the same as shown in FIG. 7.

Figure 13:
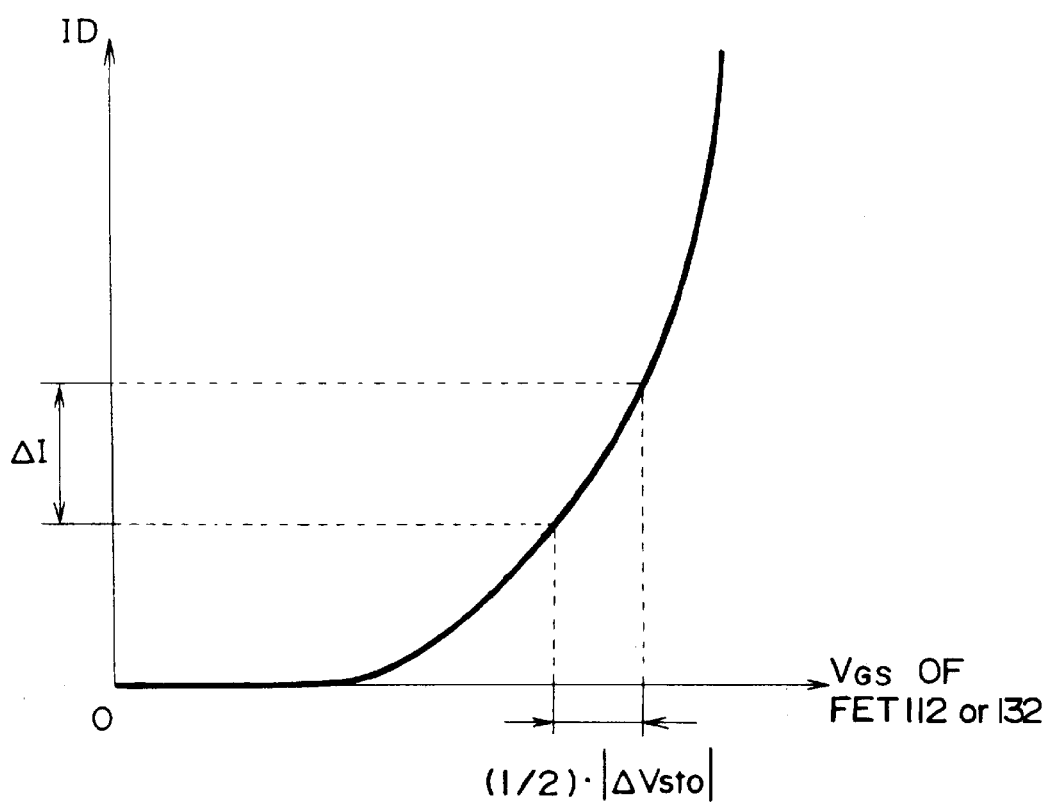
FIG. 13 is a graph illustrating a method of setting the temperature characteristics of the constant voltage $V_{reg}$ and the oscillation-stopped voltage to be the same, using a method that differs from that of the first embodiment.

The relationship between the voltage $V_{GS}$ between the gate and source of the voltage-control FETs 112 and 132 and the thus-supplied constant current $I_D$ is shown in FIG. 13. The constant current $I_D$ supplied from each of the constant-current sources 150-1 and 150-2 varies by only $\Delta I$ within the guaranteed operating temperature range. Therefore, the value of the magnitude of variation $\Delta V_{GS}$ of the voltage between the gate and source of the FETs 112 and 132 could be set to half of the magnitude of variation $\Delta V_{sto}$ of the oscillation-stopped voltage, corresponding to the magnitude of variation of $\Delta I$. In other words, it is possible to output from the constant-voltage generation circuit 100 the constant voltage $V_{reg}$ having a temperature characteristic that is the same as that of the oscillation-stopped voltage, by setting the value of the constant current $I_D$ in such a manner that the value of the magnitude of variation $\Delta V_{GS}$ of the voltage between the gate and source of each of the FETs 112 and 132 within the guaranteed operating temperature range satisfies the following equation:

$$\Delta V_{GS}=(1/2)|\Delta V_{sto}| \quad (11)$$

Application Example

Figure 14:
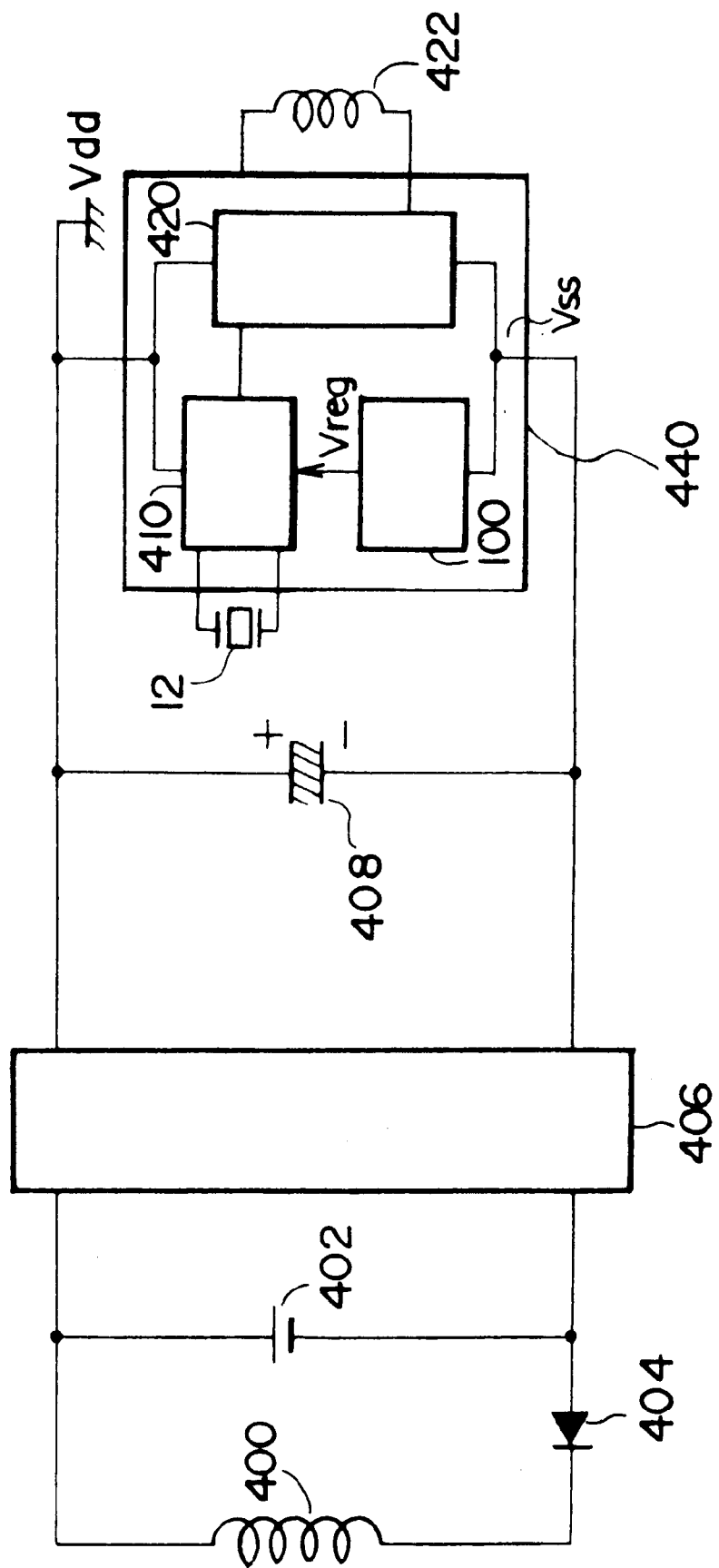
FIG. 14 is an illustrative view of a timepiece circuit in which the electronic circuit of this embodiment is used.

An example of the electronic circuitry used in a wristwatch to which this invention is applied is shown in FIG. 14.

This wristwatch has an internal electrical power generating mechanism (not shown in the figure). When the user moves the arm on which the wristwatch is worn, an oscillating weight of the electrical power generating mechanism rotates, a power-generation rotor is rotated at high speed by this kinetic energy, and an AC voltage is output from a power-generation coil 400 provided on a power-generation stator side thereof.

This AC voltage is rectified by a diode 404 and charges a secondary battery 402. This secondary battery 402 configures a main power source, together with a booster circuit 406 and an auxiliary capacitor 408.

When the voltage of the secondary battery 402 is too low to act as the drive voltage for the timepiece, the voltage of the secondary battery 402 is converted by the booster circuit 406 to a voltage high enough to drive the timepiece, and is stored in the auxiliary capacitor 408. The voltage of the auxiliary capacitor 408 acts as a power supply to drive a timepiece circuit 440.

This timepiece circuit 440 is configured as a semiconductor device comprising the crystal oscillation circuit 10 and constant-voltage generation circuit 100 of any of the above embodiments. This semiconductor device uses a crystal oscillator 12 that is connected thereto by terminals to generate an oscillation output at a pre-set oscillation frequency, which is 32768 Hz in this case, and divide this oscillation output to output drive pulses of different polarity every second. These drive pulses are input to a drive coil 422 of a stepping motor that is connected to the timepiece circuit 440. This causes the stepping motor (not shown in the figure) to drive the rotor whenever one of the drive pulses is passed, to drive the seconds hand, minutes hand, and hours hand of the timepiece (not shown in the figure), and thus provide an analog display of the time on a dial.

In this case, the timepiece circuit 440 of this embodiment comprises a power supply voltage circuit portion 420 that is driven by the voltage $V_{ss}$ supplied from the main power source, the constant-voltage generation circuit 100 that generates a predetermined constant voltage $V_{reg}$ from the power voltage of a lower value than that of the power supply voltage, and a constant voltage operating circuit portion 410 that is driven by this constant voltage $V_{reg}$.

Figure 15:
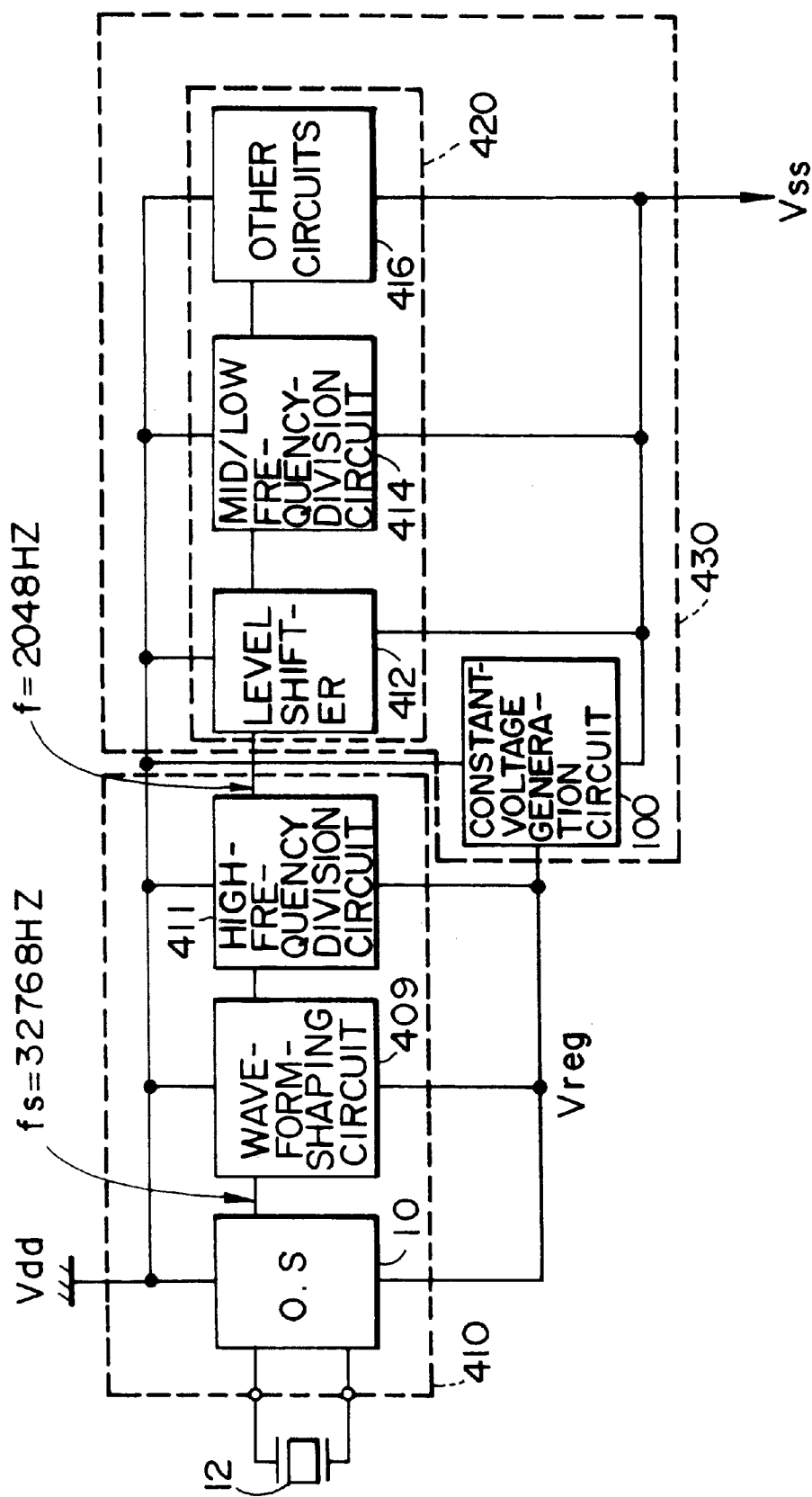
FIG. 15 is a detailed functional block diagram of a timepiece circuit.

A more detailed functional block diagram of this timepiece circuit 440 is shown in FIG. 15.

The constant voltage operating circuit portion 410 comprises the crystal oscillation circuit 10, which is configured to partially comprise the externally connected crystal oscillator 12, a waveform-shaping circuit 409, and a high-frequency division circuit 411.

The power supply voltage circuit portion 420 comprises a level shifter 412, a mid/low frequency-division circuit 414, and other circuits 416. Note that the power supply voltage circuit portion 420 and the constant-voltage generation circuit 100 in the timepiece circuit 440 of this embodiment form a power supply voltage operating circuit portion 430 that is driven by the voltage supplied from the main power source.

The crystal oscillation circuit 10 uses the crystal oscillator 12 to output a sine-wave output at a reference frequency fs of 32768 Hz to the waveform-shaping circuit 409.

After shaping this sine-wave output into a square wave, the waveform-shaping circuit 409 outputs it to the high-frequency division circuit 411.

The high-frequency division circuit 411 divides the reference frequency of 32768 Hz to 2048 Hz, then outputs that frequency-divided output to the mid/low frequency-division circuit 414 through the level shifter 412.

The mid/low frequency-division circuit 414 takes the signal that has been divided to 2048 Hz, further divides it to 1 Hz, then outputs it to the other circuits 416.

These other circuits 416 comprise a driver circuit that activates and drives a coil in synchronization with the 1-Hz frequency-divided signal, to drive a stepping motor for driving the timepiece in synchronization with this 1-Hz frequency-divided signal.

In addition to the power supply voltage operating circuit portion 430, which is driven by the power voltage $V_{ss}$ supplied from the main power source, the timepiece circuitry of this embodiment is provided with the constant voltage operating circuit portion 410, which is driven by the constant voltage $V_{reg}$ that is lower than $V_{ss}$, for the reason discussed below.

In other words, to ensure that this timepiece circuit maintains stable operation over a long time period, it is necessary to reduce the power consumption thereof.

Ordinarily, the power consumption of a circuit increases in proportion to signal frequency and circuit capacitance, and it is also proportional to the square of the power voltage supplied thereto.

If the timepiece circuitry is viewed in this case, one method of reducing the power consumption of the entire circuit would be to set the power voltage supplied to each circuit to a low value, such as $V_{reg}$. The constant-voltage generation circuit 100 can shape a minimum constant voltage $V_{reg}$ in a range that guarantees the oscillation of the crystal oscillation circuit 10.

If signal frequency is viewed next, the timepiece circuitry can be classified broadly into the crystal oscillation circuit 10, the waveform-shaping circuit 409, and the high-frequency division circuit 411 wherein signal frequencies are high, and the other circuits 420. The frequency of such signals is in a proportional relationship with the power consumption of the circuit, as previously described.

To this end, the constant-voltage generation circuit 100 of this embodiment takes the power voltage $V_{ss}$ supplied from the main power source and shapes the lower constant voltage $V_{reg}$ therefrom, then supplies it to the circuit portion 410 that handles high-frequency signals. In this manner, it is possible to efficiently decrease the power consumption of the entire timepiece circuitry by lowering the drive voltage supplied to the circuitry 410 that handles such high-frequency signals, without increasing the load on the constant-voltage generation circuit 100 too much.

As mentioned above, the timepiece circuit and incorporated electronic circuitry of this embodiment comprise the crystal oscillation circuit 10 of any of the above embodiments, together with the constant-voltage generation circuit 100 connected thereto. It is therefore possible to supply a minimum constant voltage to the crystal oscillation circuit 10 while ensuring an operating margin for the signal inversion amplifier, regardless of fabrication variations, enabling reductions in the power consumptions of the electronic and timepiece circuitry. Therefore, not only can the oscillation be stabilized in such portable electronic equipment or a timepiece, as previously described, but also the lifetime of the battery used therein can be extended, thus increasing the utility of this portable electronic equipment or timepiece.

The above reasons also make it possible to ensure an operating margin, even when there are variations in MOSFETs due to the fabrication process in timepieces or portable electronic equipment with internal silver batteries. In addition, this operating margin can be guaranteed and also the charging time can be shortened, even when there are MOS variations due to the fabrication process in a rechargeable wristwatch wherein a secondary battery configured by lithium ions is used as a power supply.

What is claimed is:

1. An electronic circuit having a constant-voltage generation circuit for creating a constant voltage,
    wherein said constant-voltage generation circuit comprises a first voltage creation circuit for creating a reference voltage, and a second voltage creation circuit for creating said constant voltage to have a predetermined relationship with said reference voltage;
    wherein said first voltage creation circuit comprises a first constant-current source for supplying a constant current, and a circuit having a first voltage-control transistor through which said constant current is passed and which outputs said reference voltage with reference to a predetermined potential; and
    wherein said constant current is set to a value within a saturated operating region of said first voltage-control transistor.

2. The electronic circuit as defined in claim 1, wherein said constant current is a first constant current, and said second voltage creation circuit comprises:
    a differential amplifier for amplifying the difference between said reference voltage and a comparison voltage;
    a second constant-current source for supplying a second constant current;
    a circuit having a second voltage-control transistor to which said second constant current is supplied; and
    an output transistor which is connected in series with said circuit having said second voltage-control transistor to be supplied with said second constant current, the resistance of said output transistor being controlled by an output of said differential amplifier;
    wherein said comparison voltage is output from one end of said circuit having said second voltage-control transistor, using a predetermined potential as reference, while said constant voltage being output from another end of said circuit having said second voltage-control transistor; and
    wherein said second constant current is set to a value within a saturated operating region of said second voltage-control transistor.

3. The electronic circuit as defied in claim 2,
    wherein said first constant-current source and second constant-current source are formed under the same fabrication conditions.

4. The electronic circuit as defined in claim 1,
    wherein said first voltage-control transistor is selected from a plurality of transistors having mutually different current amplification ratios.

5. The electronic circuit as defined in claim 1, wherein the electronic circuit is provided in a semiconductor device.

6. The electronic circuit as defined in claim 1, wherein the electronic circuit is provided in an electronic equipment and an operating reference signal is generated from an oscillation output of said crystal oscillation circuit.

7. The electronic circuit as defined in claim 1, wherein the electronic circuit is provided in a timepiece and a timepiece reference signal is generated from an oscillation output of said crystal oscillation circuit.

8. An electronic circuit having a constant-voltage generation circuit for creating a constant voltage,
    wherein said constant-voltage generation circuit comprises a first voltage creation circuit for creating a reference voltage, and a second voltage creation circuit for creating said constant voltage and a comparison voltage having a predetermined relationship with said constant voltage;
    wherein said second voltage creation circuit comprises:
        a differential amplifier for amplifying the difference between said reference voltage and said comparison voltage;
        a constant-current source for supplying a constant current;
        a circuit having a voltage-control transistor to which said constant current is supplied; and
        an output transistor which is connected in series with said circuit having said voltage-control transistor to be supplied with said constant current, the resistance of said output transistor being controlled by an output of said differential amplifier;
    wherein said comparison voltage is output from one end of said circuit having said voltage-control transistor, using a predetermined potential as reference, while said constant voltage being output from another end of said circuit having said voltage-control transistor; and
    wherein said constant current is set to a value within a saturated operating region of said voltage-control transistor.

9. The electronic circuit as defined in claim 8,
    wherein said voltage-control transistor is selected from a plurality of transistors having mutually different current amplification ratios.

10. The electronic circuit as defined in claim 8, wherein the electronic circuit is provided in a semiconductor device.

11. The electronic circuit as defined in claim 8, wherein the electronic circuit is provided in and electronic equipment and an operating reference signal is generated from an oscillation output of said crystal oscillation circuit.

12. The electronic circuit as defined in claim 8, wherein the electronic circuit is provided in a timepiece and a timepiece reference signal is generated from an oscillation output of said crystal oscillation circuit.

13. An electronic circuit having a constant-voltage generation circuit for creating a constant voltage,
    wherein said constant-voltage generation circuit comprises a first voltage creation circuit for creating a reference voltage, and a second voltage creation circuit for creating said constant voltage to have a predetermined relationship with said reference voltage;
    wherein said first voltage creation circuit comprises a first constant-current source for supplying a constant current, and a circuit having a first voltage-control transistor through which said constant current is passed and which outputs said reference voltage with reference to a predetermined potential; and wherein said constant current is set to a value within a saturated operating region of said first voltage-control transistor, and said first voltage-control transistor is selected from a plurality of transistors having mutually different current amplification ratios.

14. The electronic circuit as defined in claim 13, wherein said constant current is a first constant current, and said second voltage creation circuit comprises:

a differential amplifier for amplifying the difference between said reference voltage and a comparison voltage;

a second constant-current source for supplying a second constant current;

a circuit having a second voltage-control transistor to which said second constant current is supplied; and an output transistor which is connected in series with said circuit having said second voltage-control transistor to be supplied with said second constant current, the resistance of said output transistor being controlled by an output of said differential amplifier;

wherein said comparison voltage and said constant voltage are output with reference to a predetermined potential from one end and another end of said circuit having said second voltage-control transistor; and wherein said second voltage-control transistor is selected from a plurality of transistors having mutually different current amplification ratios.

15. The electronic circuit as defined in claim 14, wherein at least one of said first constant current and said second constant current is set to a value such that the magnitude of voltage variation within a guaranteed operating temperature range of said first voltage-control transistor and said second voltage-control transistor is one half the magnitude of variation of an oscillation-stopped voltage of a crystal oscillation circuit supplied with said constant voltage within the guaranteed operating temperature range.

16. The electronic circuit as defined in claim 13, wherein the electronic circuit is provided in a semiconductor device.

17. The electronic circuit as defined in claim 13, wherein the electronic circuit is provided in an electronic equipment and an operating reference signal is generated from an oscillation output of said crystal oscillation circuit.

18. The electronic circuit as defined in claim 13, wherein the electronic circuit is provided in a timepiece and a timepiece reference signal is generated from an oscillation output of said crystal oscillation circuit.

19. An electronic circuit having a constant-voltage generation circuit for creating a constant voltage, wherein said constant-voltage generation circuit comprises a first voltage creation circuit for creating a reference voltage, and a second voltage creation circuit for creating said constant voltage and a comparison voltage having a predetermined relationship with said constant voltage;

wherein said second voltage creation circuit comprises:
a differential amplifier for amplifying the difference between said reference voltage and said comparison voltage;
a constant-current source for supplying a constant current;

a circuit having a voltage-control transistor to which said constant current is supplied; and an output which is connected in series with said circuit having said voltage-control transistor to be supplied with said constant current, the resistance of said output transistor being controlled by an output of said differential amplifier;

wherein said comparison voltage and said constant voltage are output with reference to a predetermined potential from one end and another end of said circuit having said voltage-control transistor; and wherein said voltage-control transistor is selected from a plurality of transistors having mutually different current amplification ratios.

20. The electronic circuit as defined in claim 19, wherein the electronic circuit is provided in an electronic equipment and an operating reference signal is generated from an oscillation output of said crystal oscillation circuit.

21. The electronic circuit as defined in claim 19, wherein the electronic circuit is provided in a semiconductor device.

22. The electronic circuit as defined in claim 19, wherein the electronic circuit is provided in a timepiece and a timepiece reference signal is generated from an oscillation output of said crystal oscillation circuit.

23. An electronic equipment having a constant-voltage generation circuit for creating a constant voltage, wherein said constant-voltage generation circuit comprises a first voltage creation circuit for creating a reference voltage, and a second voltage creation circuit for creating said constant voltage to have a predetermined relationship with said reference voltage;

wherein said first voltage creation circuit comprises a first constant-current source for supplying a constant current, and a circuit having a first voltage-control transistor through which said constant current is passed and which outputs said reference voltage with reference to a predetermined potential; and wherein said constant current is set to a value within a saturated operating region of said first voltage-control transistor.

24. An electronic equipment having a constant-voltage generation circuit for creating a constant voltage, wherein said constant-voltage generation circuit comprises a first voltage creation circuit for creating a reference voltage, and a second voltage creation circuit for creating said constant voltage and a comparison voltage having a predetermined relationship with said constant voltage;

wherein said second voltage creation circuit comprises:
a differential amplifier for amplifying the difference between said reference voltage and said comparison voltage;
a constant-current source for supplying a constant current;

a circuit having a voltage-control transistor to which said constant current is supplied; and an output transistor which is connected in series with said circuit having said voltage-control transistor to be supplied with said constant current, the resistance of said output transistor being controlled by an output of said differential amplifier;

wherein said comparison voltage is output from one end of said circuit having said voltage-control transistor, using a predetermined potential as reference, while said constant voltage being output from another end of said circuit having said voltage-control transistor; and wherein said constant current is set to a value within a saturated operating region of said voltage-control transistor.

25. An electronic equipment having a constant-voltage generation circuit for creating a constant voltage, wherein said constant-voltage generation circuit comprises a first voltage creation circuit for creating a reference voltage, and a second voltage creation circuit for creating said constant voltage to have a predetermined relationship with said reference voltage;

wherein said first voltage creation circuit comprises a first constant-current source for supplying a constant current, and a circuit having a first voltage-control transistor through which said constant current is passed and which outputs said reference voltage with reference to a predetermined potential; and wherein said constant current is set to a value within a saturated operating region of said first voltage-control transistor, and said first voltage-control transistor is selected from a plurality of transistors having mutually different current amplification ratios.

26. An electronic equipment having a constant-voltage generation circuit for creating a constant voltage, wherein said constant-voltage generation circuit comprises a first voltage creation circuit for creating a reference voltage, and a second voltage creation circuit for creating said constant voltage and a comparison voltage having a predetermined relationship with said constant voltage;

wherein said second voltage creation circuit comprises:
a differential amplifier for amplifying the difference between said reference voltage and said comparison voltage;
a constant-current source for supplying a constant current;
a circuit having a voltage-control transistor to which said constant current is supplied; and
an output which is connected in series with said circuit having said voltage-control transistor to be supplied with said constant current, the resistance of said output transistor being controlled by an output of said differential amplifier;

wherein said comparison voltage and said constant voltage are output with reference to a predetermined potential from one end and another end of said circuit having said voltage-control transistor; and wherein said voltage-control transistor is selected from a plurality of transistors having mutually different current amplification ratios.

\* \* \* \* \*